(12) United States Patent
Chang et al.

(10) Patent No.: US 11,923,253 B2
(45) Date of Patent: Mar. 5, 2024

(54) INTEGRATED CIRCUIT STRUCTURE

(71) Applicant: TAIWAN SEMICONDUCTOR MANUFACTURING CO., LTD., Hsinchu (TW)

(72) Inventors: Kuei-Ming Chang, New Taipei (TW); Rei-Jay Hsieh, Miaoli County (TW); Cheng-Han Wu, Hsinchu (TW); Chie-luan Lin, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/167,442

(22) Filed: Feb. 10, 2023

(65) Prior Publication Data

US 2023/0187283 A1 Jun. 15, 2023

Related U.S. Application Data

(63) Continuation of application No. 17/384,888, filed on Jul. 26, 2021, now Pat. No. 11,581,227, which is a continuation of application No. 16/933,088, filed on Jul. 20, 2020, now Pat. No. 11,075,125, which is a continuation of application No. 16/221,740, filed on
(Continued)

(51) Int. Cl.
| | |
|---|---|
| *H01L 21/8238* | (2006.01) |
| *H01L 21/762* | (2006.01) |
| *H01L 21/8234* | (2006.01) |
| *H01L 27/092* | (2006.01) |
| *H01L 29/06* | (2006.01) |
| *H01L 29/08* | (2006.01) |

(Continued)

(52) U.S. Cl.
CPC ........ *H01L 21/823878* (2013.01); *H01L 21/76232* (2013.01); *H01L 21/823481* (2013.01); *H01L 21/823814* (2013.01); *H01L 21/823821* (2013.01); *H01L 27/0924* (2013.01); *H01L 29/0653* (2013.01); *H01L 29/0847* (2013.01); *H01L 29/66545* (2013.01); *H01L 29/7848* (2013.01)

(58) Field of Classification Search
CPC ....... H01L 21/823878; H01L 21/76232; H01L 21/823481; H01L 21/823814; H01L 21/823821; H01L 27/0924; H01L 29/0653; H01L 29/0847; H01L 29/66545; H01L 29/7848
See application file for complete search history.

(56) References Cited

U.S. PATENT DOCUMENTS 6,359,311 B1  3/2002  Colinge et al.
8,609,510 B1  12/2013  Banna et al.
(Continued)

*Primary Examiner* — Sitaramarao S Yechuri
(74) *Attorney, Agent, or Firm* — Slater Matsil, LLP

(57) ABSTRACT

A device includes a first transistor, a second transistor, and a dielectric structure. The first transistor is over a substrate and has a first gate structure. The second transistor is over the substrate and has a second gate structure. The dielectric structure is between the first gate structure and the second gate structure. The dielectric structure has a width increasing from a bottom position of the dielectric structure to a first position higher than the bottom position of the dielectric structure. A width of the first gate structure is less than the width of the dielectric structure at the first position.

20 Claims, 22 Drawing Sheets

Related U.S. Application Data

Dec. 17, 2018, now Pat. No. 10,720,362, which is a continuation of application No. 15/635,308, filed on Jun. 28, 2017, now Pat. No. 10,157,800.

(60) Provisional application No. 62/489,436, filed on Apr. 24, 2017.

(51) Int. Cl.
*H01L 29/66* (2006.01)
*H01L 29/78* (2006.01)

(56) References Cited

U.S. PATENT DOCUMENTS

| | | | |
|---|---|---|---|
| 8,753,970 | B2 | 6/2014 | Xie et al. |
| 9,412,616 | B1 | 8/2016 | Xie et al. |
| 9,721,804 | B1 | 8/2017 | Wei et al. |
| 9,735,060 | B1 | 8/2017 | Sung et al. |
| 2005/0142806 | A1 | 6/2005 | Song |
| 2007/0155119 | A1 | 7/2007 | Muemmler et al. |
| 2007/0231997 | A1 | 10/2007 | Doyle et al. |
| 2012/0086053 | A1 | 4/2012 | Tseng et al. |
| 2012/0149171 | A1* | 6/2012 | Liaw .............. H01L 21/76232 |
| | | | 257/E21.549 |
| 2013/0187237 | A1 | 7/2013 | Yu et al. |
| 2014/0306289 | A1 | 10/2014 | Basker et al. |
| 2014/0308806 | A1 | 10/2014 | Chang et al. |
| 2015/0008483 | A1 | 1/2015 | Ching et al. |
| 2015/0115363 | A1 | 4/2015 | Chang et al. |
| 2015/0187571 | A1 | 7/2015 | Fan et al. |
| 2015/0187944 | A1 | 7/2015 | Ching et al. |
| 2015/0236132 | A1 | 8/2015 | Chang et al. |
| 2015/0340294 | A1 | 11/2015 | Divakaruni et al. |
| 2016/0133624 | A1 | 5/2016 | Liao |
| 2016/0163604 | A1* | 6/2016 | Xie .................. H01L 21/845 |
| | | | 438/430 |
| 2016/0225764 | A1 | 8/2016 | Chang et al. |
| 2017/0040415 | A1 | 2/2017 | Liou et al. |
| 2017/0125588 | A1* | 5/2017 | Zhou ................ H01L 29/7848 |
| 2017/0207216 | A1 | 7/2017 | Peng et al. |
| 2017/0365712 | A1 | 12/2017 | Bu et al. |

* cited by examiner

INTEGRATED CIRCUIT STRUCTURE

PRIORITY CLAIM AND CROSS-REFERENCE

The present application is a continuation application of U.S. application Ser. No. 17/384,888, filed on Jul. 26, 2021, now U.S. Pat. No. 11,581,227, issued on Feb. 14, 2023, which is a continuation application of U.S. application Ser. No. 16/933,088, filed on Jul. 20, 2020, now U.S. Pat. No. 11,075,125, issued on Jul. 27, 2021, which is a continuation application of U.S. application Ser. No. 16/221,740, filed on Dec. 17, 2018, now U.S. Pat. No. 10,720,362, issued on Jul. 21, 2020, which is a continuation application of U.S. application Ser. No. 15/635,308, filed on Jun. 28, 2017, now U.S. Pat. No. 10,157,800, issued on Dec. 18, 2018, which claims priority of U.S. Provisional Application Ser. No. 62/489,436, filed on Apr. 24, 2017, all of which are herein incorporated by reference in their entireties.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
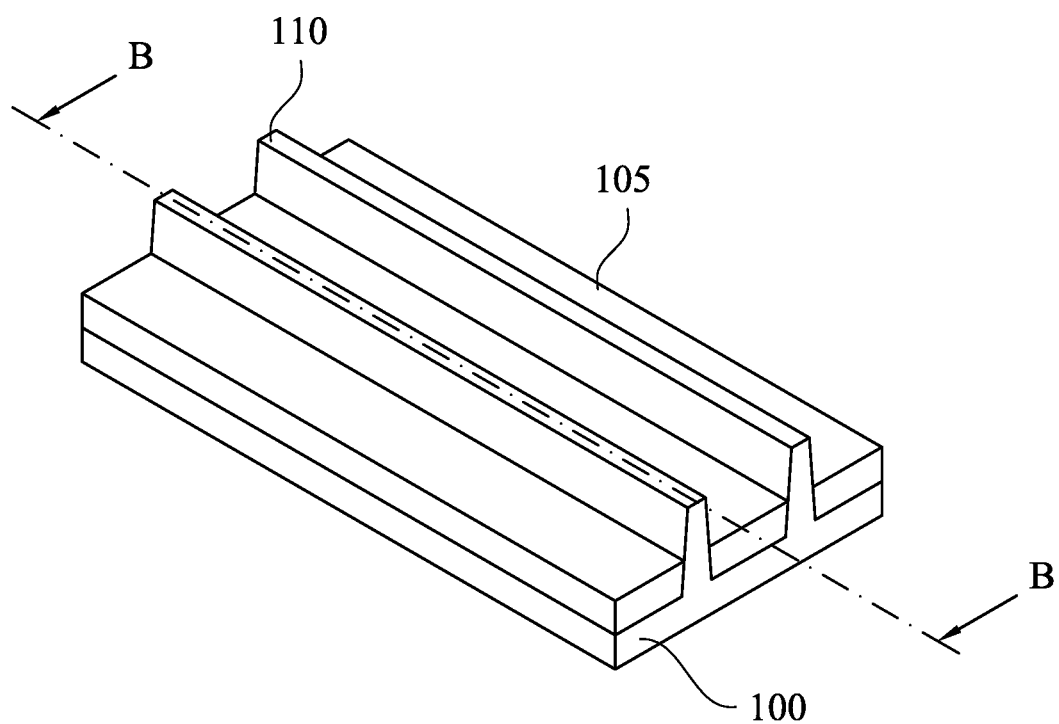
FIGS. 1A-10B illustrate a method of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 10A are perspective views of a method of manufacturing a semiconductor device at various stages in accordance with some embodiments. FIGS. 1B to 10B are cross-sectional views along line B-B of FIGS. 1A to 10A, respectively.

Figure 1B:
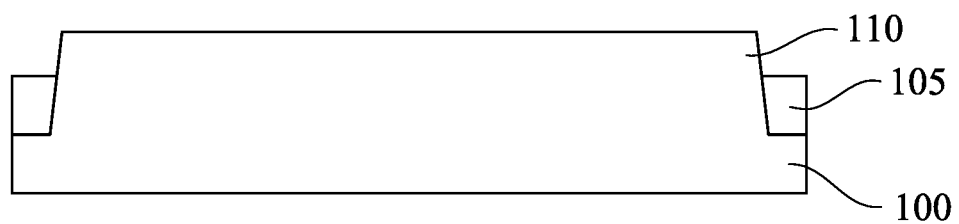

Reference is made to FIGS. 1A and 1B. Semiconductor fins 110 are formed on a substrate 100. The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The substrate 100 may also include various doped regions. The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

The semiconductor fins 110 may be formed by any suitable method. For example, the semiconductor fins 110 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

A plurality of isolation structures 105 are formed over the substrate 100 and adjacent to the semiconductor fins 110. The isolation structures 105, which act as a shallow trench isolation (STI) around the semiconductor fins 110 may be formed by chemical vapor deposition (CVD) techniques using tetra-ethyl-ortho-silicate (TEOS) and oxygen as a precursor. In yet some other embodiments, the isolation structure 105 is insulator layers of a SOI wafer.

Figure 2A:
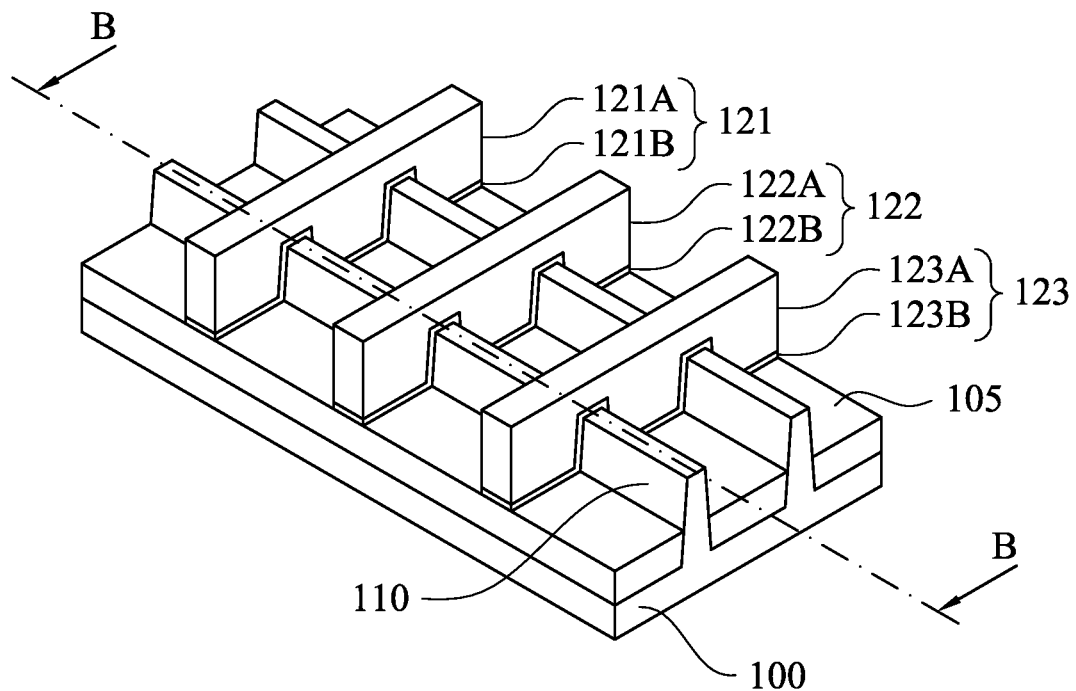
Figure 2B:
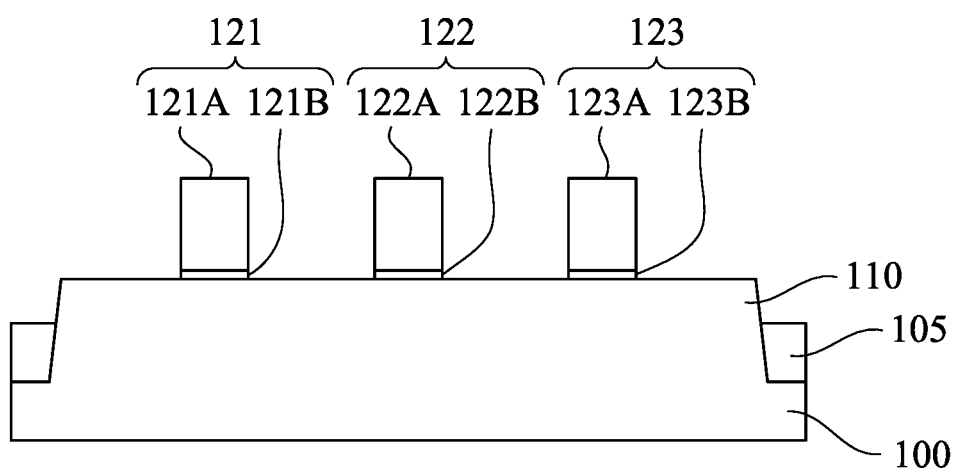

Reference is made to FIGS. 2A and 2B. A plurality of dummy gate stacks 121, 122, and 123 are formed over the semiconductor fins 110 of the substrate 100, in which the dummy gate stack 122 is between the dummy gates 121 and 123.

In some embodiments, the dummy gate stack 121 includes a dummy gate 121A and a gate dielectric 121B underlying the dummy gate 121A, the dummy gate stack 122 includes a dummy gate 122A and a gate dielectric 122B underlying the dummy gate 122A, and the dummy gate stack 123 includes a dummy gate 123A and a gate dielectric 123B underlying the dummy gate 123A. The dummy gates 121A, 122A, and 123A may include polycrystalline-silicon (poly-Si) or poly-crystalline silicon-germanium (poly-SiGe). Further, the dummy gates 121A, 122A, and 123A may be doped poly-silicon with uniform or non-uniform doping. The gate dielectrics 121B, 122B, and 123B may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

In some embodiments, the dummy gate stacks 121, 122, and 123 may be formed by, for example, forming a stack of a gate dielectric layer and a dummy gate material layer over the substrate 100. A patterned mask is formed over the stack of gate dielectric layer and dummy gate material layer. Then, the gate dielectric layer and the dummy gate material layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric until the semiconductor fins 110 is exposed.

Figure 3A:
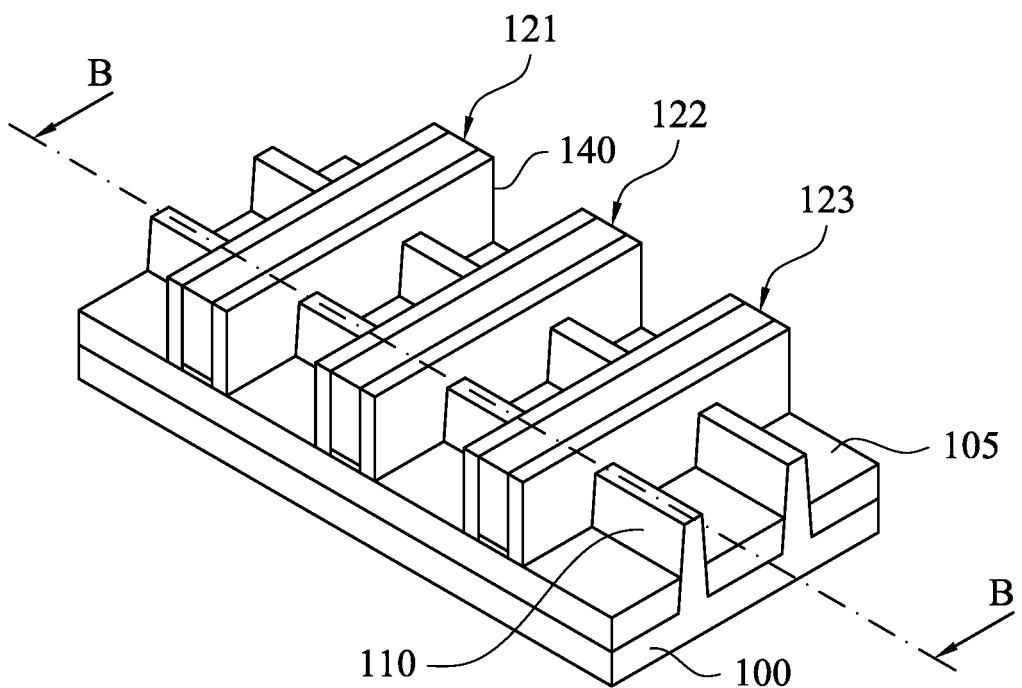
Figure 3B:
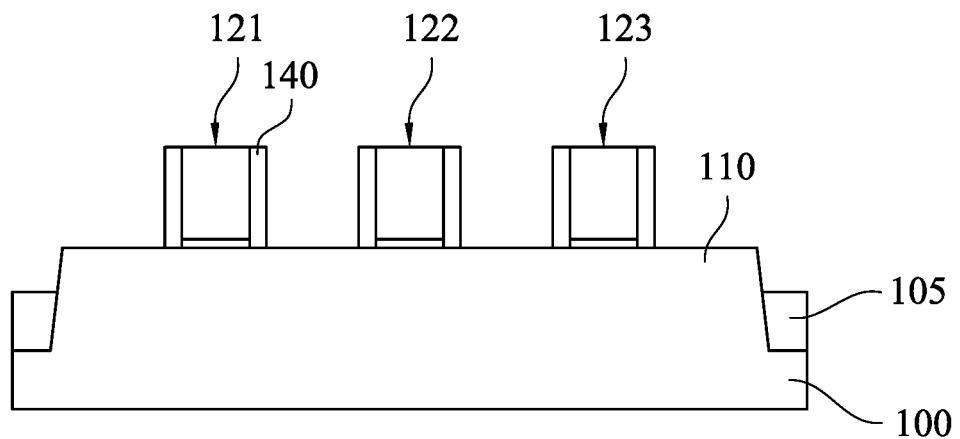

Reference is made to FIGS. 3A and 3B. A plurality of gate spacers 140 are formed respectively on opposite sidewalls of the dummy gate stacks 121, 122, and 123. In some embodiments, at least one of the gate spacers 140 includes single or multiple layers. The gate spacers 140 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like. The gate spacers 140 may be formed by methods such as CVD, plasma enhanced CVD, sputter, or the like. The gate spacers 140 may then be patterned, such as by one or more etch processes to remove horizontal portions of the gate spacers 140 from the horizontal surfaces of the structure.

Figure 4A:
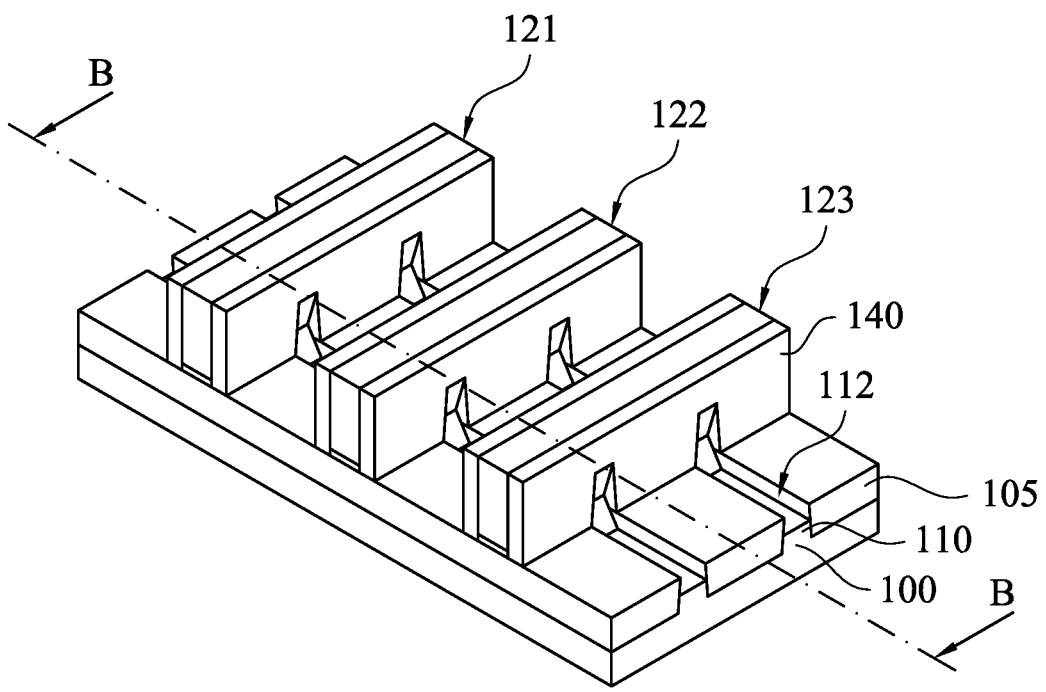
Figure 4B:
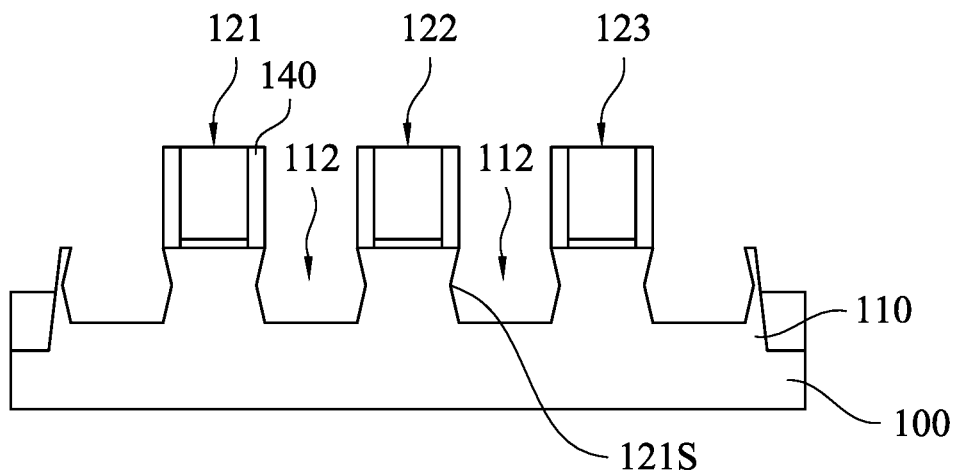

Reference is made to FIGS. 4A and 4B. The semiconductor fins 110 are recessed to form a plurality of recesses 112 in the semiconductor fins 110 of the substrate 100. In some embodiments, the recesses 112 can be formed to have a substantially diamond-shaped profile, as shown in FIG. 4B. That is, some sidewalls 121S of the recesses 112 are extended towards a position vertically below the gate spacers 140. In some other embodiments, the recesses 112 can be formed to have a substantially U-shaped profile (not shown), and a sidewall of the recess 112 can be substantially aligned with the edge (or outer boundary) of the gate spacer 140.

Formation of the recesses 112 may include a dry etching process, a wet etching process, or combination of dry and wet etching processes. In some embodiments, the substantially diamond-shaped recesses 112 can be formed with an etching process that includes dry etching and wet etching processes where etching parameters thereof are tuned (such as etchants used, etching temperature, etching solution concentration, etching pressure, source power, radio frequency (RF) bias voltage, RF bias power, etchant flow rate, and other suitable parameters) to achieve the predetermined recess profile. After the etching process, a pre-cleaning process may be performed to clean the recesses 112 with hydrofluoric acid (HF) or other suitable solution in some embodiments.

The semiconductor fins 110 of the substrate 100 may be recessed by suitable process including dry etching process, wet etching process, and/or combination thereof. The recessing process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Figure 5A:
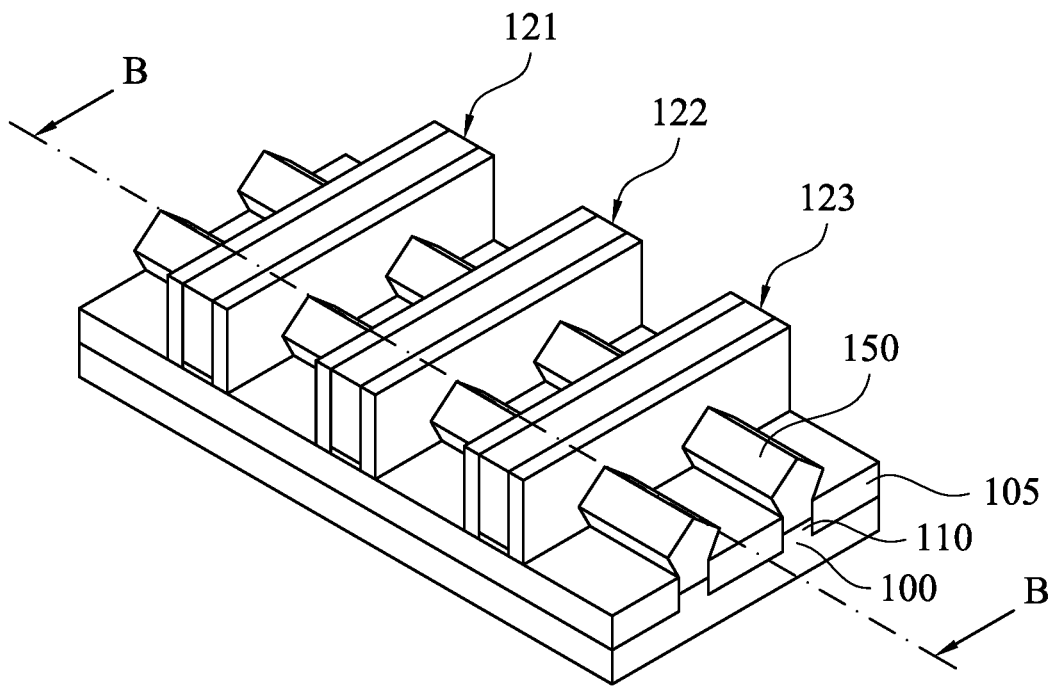
Figure 5B:
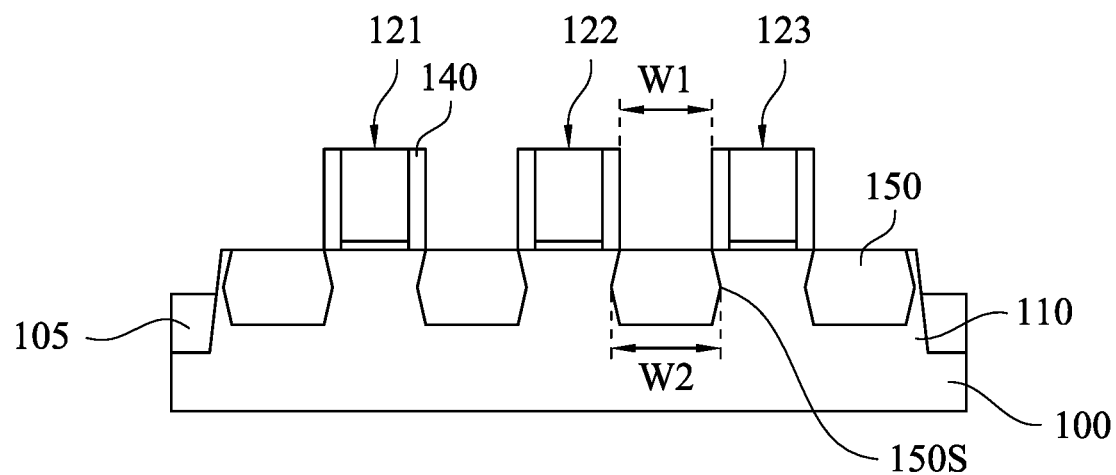

Reference is made to FIGS. 5A and 5B. A plurality of source/drain features 150 are respectively formed in the recesses 112 (shown in FIG. 4B) of the semiconductor fins 110 of the substrate. At least one of the source/drain features 150 is formed between the dummy gate stacks 121 and 122, and at least one of the source/drain features 150 is formed between the dummy gate stacks 122 and 123. In FIG. 5B, sidewalls 150S of the source/drain features 150 extend to a position vertically below the gate spacers 140. Accordingly, a gap between two gate spacers 140 and over the source/drain feature 150 has a greatest width W1 less than a greatest width W2 of the underlying source/drain feature 150.

In some embodiments, the source/drain features 150 may be epitaxy structures, and may also be referred to as epitaxy features 150. The source/drain features 150 may be formed using one or more epitaxy or epitaxial (epi) processes, such that Si features, SiGe features, and/or other suitable features can be formed in a crystalline state on the semiconductor fins 110. In some embodiments, lattice constants of the source/drain features 150 are different from lattice constants of the semiconductor fins 110, such that channels in the semiconductor fins 110 are strained or stressed to enable carrier mobility of the semiconductor device and enhance the device performance. In some embodiments, the source/drain features 150 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 110 (e.g., silicon). The source/drain features 150 may be in-situ doped. The doping species include P-type dopants, such as boron or $BF_2$; N-type dopants, such as phosphorus or arsenic; and/or other suitable dopants including combinations thereof. If the source/drain features 150 are not in-situ doped, a second implantation process (i.e., a junction implant process) is performed to dope the source/drain features 150. One or more annealing processes may be performed to activate the source/drain features 150. The annealing processes include rapid thermal annealing (RTA) and/or laser annealing processes.

Figure 6A:
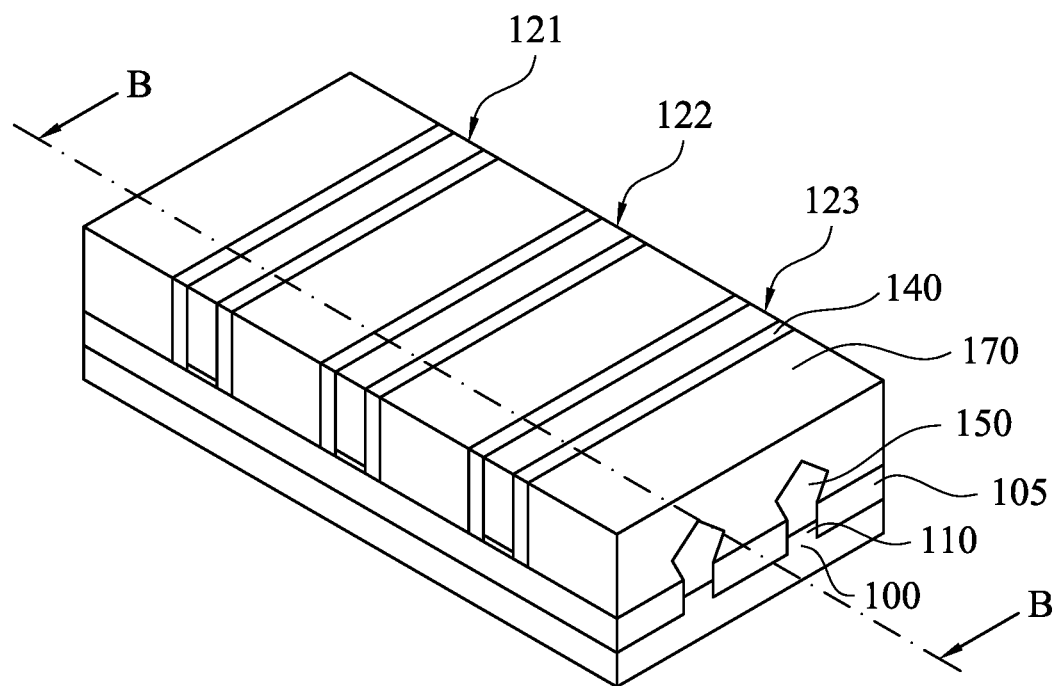
Figure 6B:
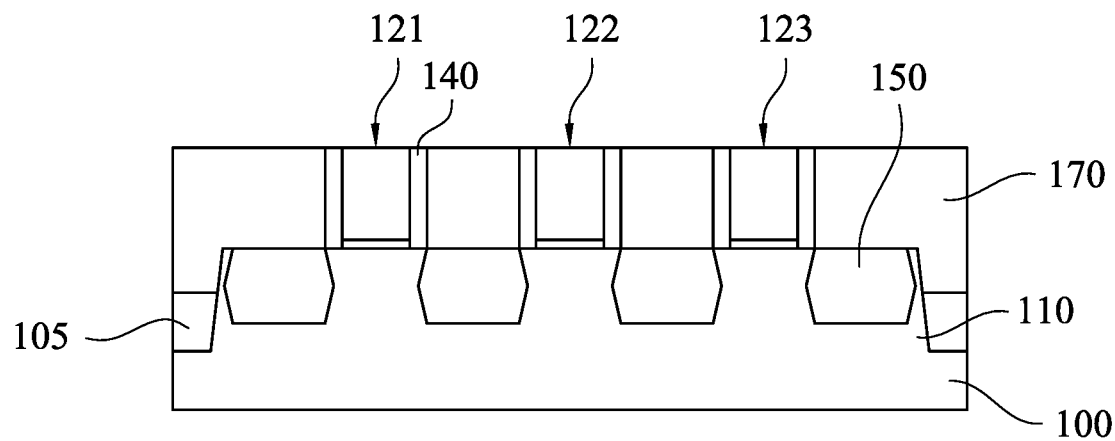

Reference is made to FIGS. 6A and 6B. After the source/drain features 150 are formed, an interlayer dielectric (ILD) 170 is formed over the substrate 100 and at outer sides of the gate spacers 140. Accordingly, the interlayer dielectric 170 covers the source/drain features 150 and portions of the semiconductor fins 110 of the substrate 100. The interlayer dielectric 170 may include silicon oxide, oxynitride or other suitable materials. The interlayer dielectric 170 includes a single layer or multiple layers. The interlayer dielectric 170 can be formed by a suitable technique, such as CVD or ALD. A chemical mechanical polishing (CMP) process may be performed to remove interlayer dielectric 170 until reaching the dummy gate stacks 121, 122 and 123. After the chemical mechanical planarization (CMP) process, the dummy gate stacks 121, 122, and 123 are exposed from the interlayer dielectric 170. In some embodiments, a contact etch stop layer (CESL) is blanket formed over the substrate 100 prior to the formation of the ILD 170.

Figure 7A:
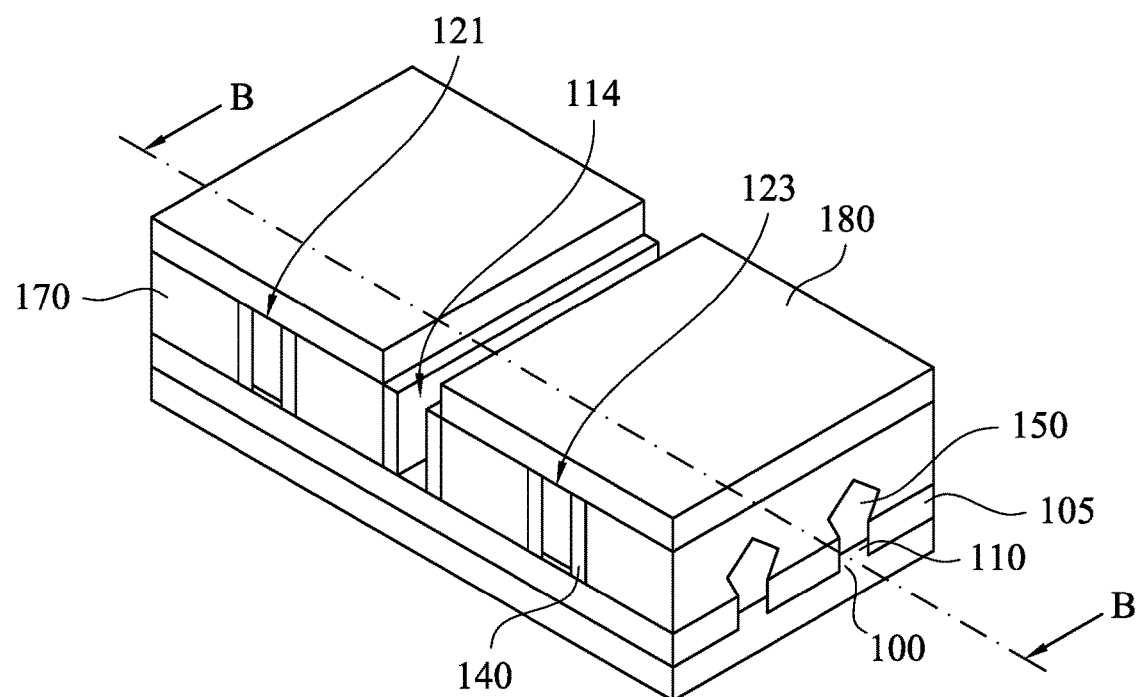
Figure 7B:
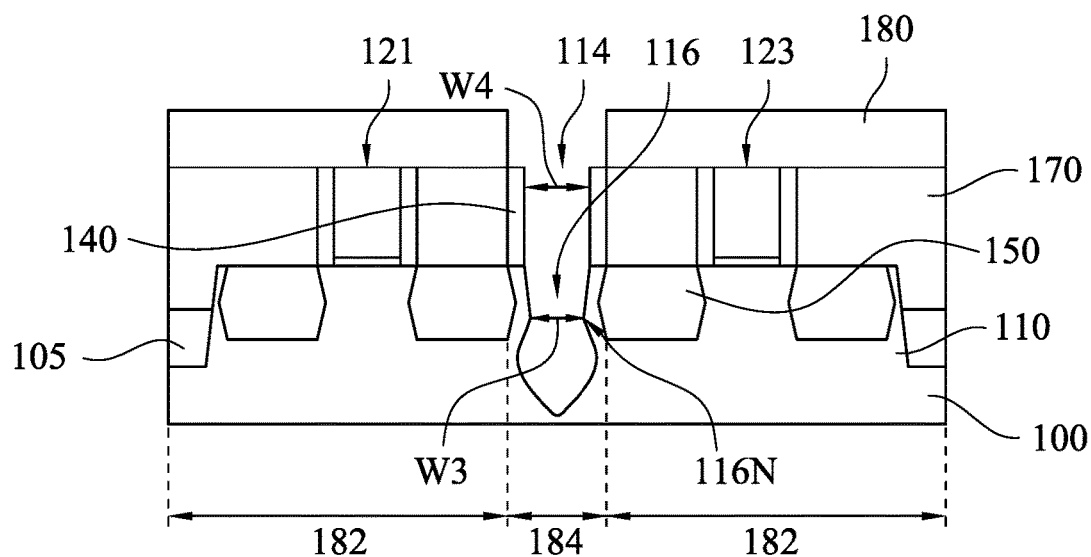

Reference is made to FIGS. 7A and 7B. A patterned mask 180 is formed over the semiconductor fins 110 of the substrate 100. In some embodiments, the patterned mask 180 is over the interlayer dielectric 170 and the dummy gates 121 and 123 to define two masked regions 182 and an unmasked region 184. In other words, the mask 180 exposes the dummy gate stack 122 (see FIG. 6B) in the unmasked region 184, and the dummy gate stacks 121 and 123 in the masked regions 182 may be protected by the hard mask 180 during processes performed later.

Then, one or more etching processes are performed using the mask 180 as an etching mask. In some embodiments, for example, one or more etching processes are performed to remove the dummy gate stack 122 (see FIG. 6B). After the dummy gate stack 122 is removed, a gate trench 114 is formed in between the gate spacers 140, and a portion of the semiconductor fin 110 is exposed at a bottom of the gate trench 114. Thereafter, an etching process is then performed to the exposed semiconductor fin 110 to form a recess 116 in the substrate 100. As a result of the etching processes performed to the unmasked region 184, the gate trench 114 is vertically above and spatially communicated with the recess 116 in the substrate 100.

In some embodiments, the etching process for recessing the semiconductor fin 110 may be anisotropic etching, such as plasma etching. One or more etching parameters of this etching process are tuned to control the profile of the recess 116 in the substrate 100. In some embodiments, the etching parameters include total pressure of etch gas(es), partial pressure of oxygen in the etch gases, radio frequency (RF) bias voltage, RF bias power, the like or combinations thereof. As a result of the tuned etching parameters, the recess 116 has a bowling-like cross-sectional profile. For example, the recess includes a waist 116N having a width W3, in which the width W3 is less than widths of other portions of the recess 116 above or below the waist 116N. In some embodiments, the waist 116N is the narrowest portion of the recess 116. Moreover, the width W3 of the waist 116N of the recess 116 is less than a width W4 of the gate trench 114.

The waist 116N of the recess 116 is in a position higher than a bottom of the neighboring source/drain feature 150. As a result, the narrowest portion of the recess 116 is in between two neighboring source/drain features 150. Therefore, even if the source/drain features 150 laterally extend to positions below the gate spacers 140, etching of the recess 116 will not affect the source/drain features 150. For example, a shortest distance between the neighboring diamond-shaped source/drain features 150 is greater than the width W3 of the waist 116N. In this way, the source/drain features 150 proximate the recess 116 will be free of damage during the etching of the recess 116 even if the diamond-shaped profile results in considerable lateral extensions of the source/drain features 150.

Moreover, a lower portion of the recess 116 below the waist 116N can be wider than the waist 116N due to the tuned etching parameters, and hence the lower portion of the recess 116 will not unduly shrink because of creating the waist 116N. As a result, the lower portion of the recess 116 can be kept in a moderate size such that a dielectric plug subsequently formed in the recess 116 can provide sufficient isolation to the source/drain features 150 on opposite sides of the recess 116.

In some embodiments, the one or more etching processes that removes the dummy gate stack 122 may be a selective etch process, including a selective wet etch or a selective dry etch, and carries a substantially vertical profile of the gate spacers 140. With the selective etch process, the gate trench 114 is formed with a self-alignment nature, which relaxes process constrains, such as misalignment, and/or overlay issue in lithograph process, recess profile controlling in etch process, pattern loading effect, and etch process window.

Figure 8A:
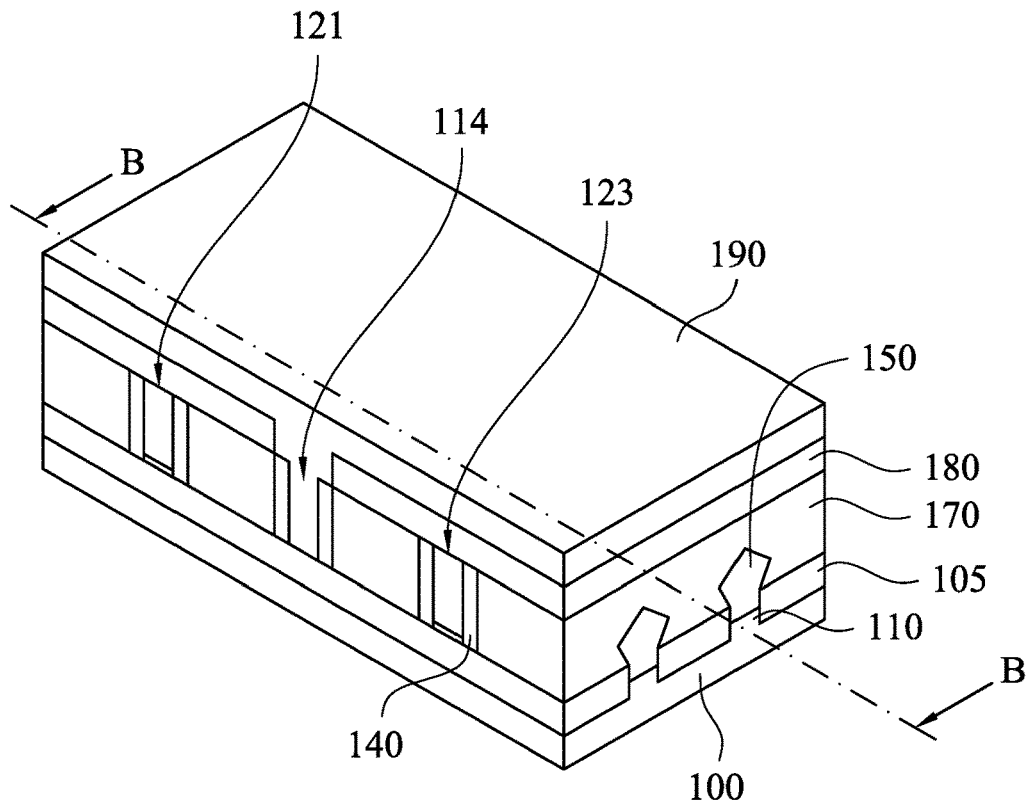
Figure 8B:
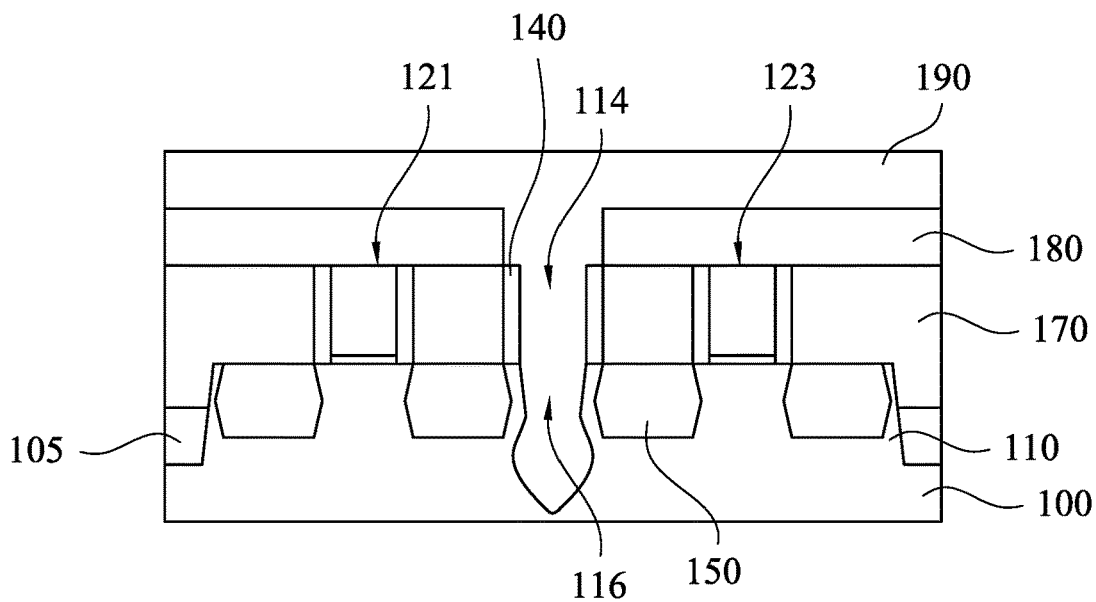

Reference is made to FIGS. 8A and 8B. A dielectric layer 190 is formed over the mask layer 180 and the semiconductor fins 110 of the substrate 100 and filling the gate trench 114 and the recess 116. In some embodiments, the dielectric layer 190 may include silicon nitride, silicon oxynitride, silicon oxycarbonitride, silicon carbide, silicon germanium, or combinations thereof. The dielectric layer 190 may be formed by a suitable technique, such as CVD, ALD and spin-on coating. In some embodiments, air gaps may be created in the dielectric layer 190.

Figure 9A:
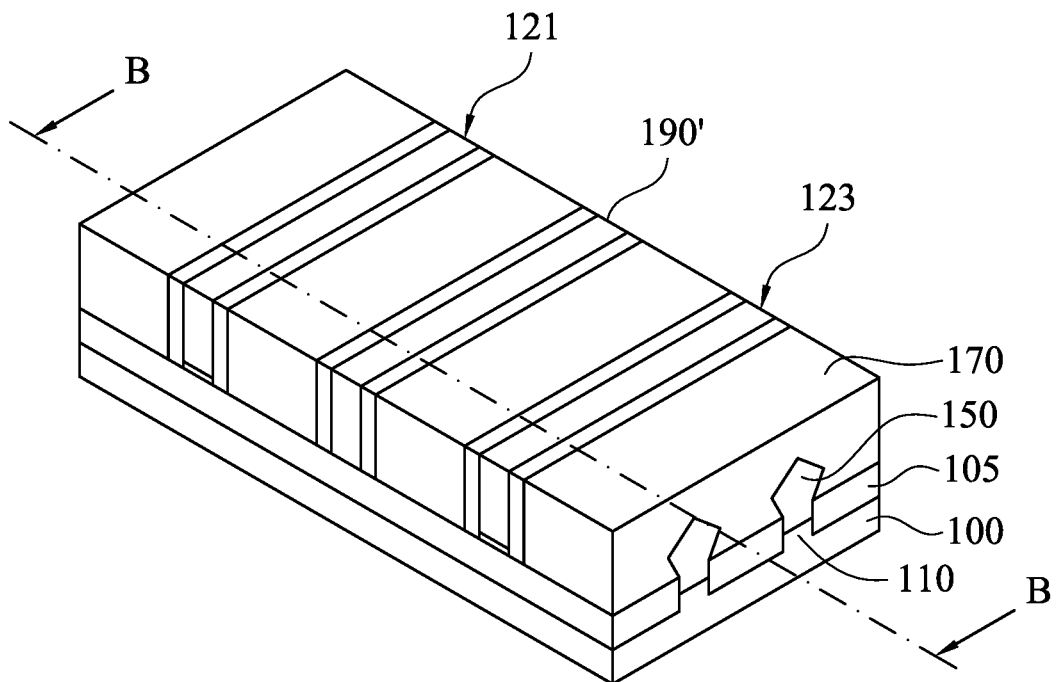
Figure 9B:
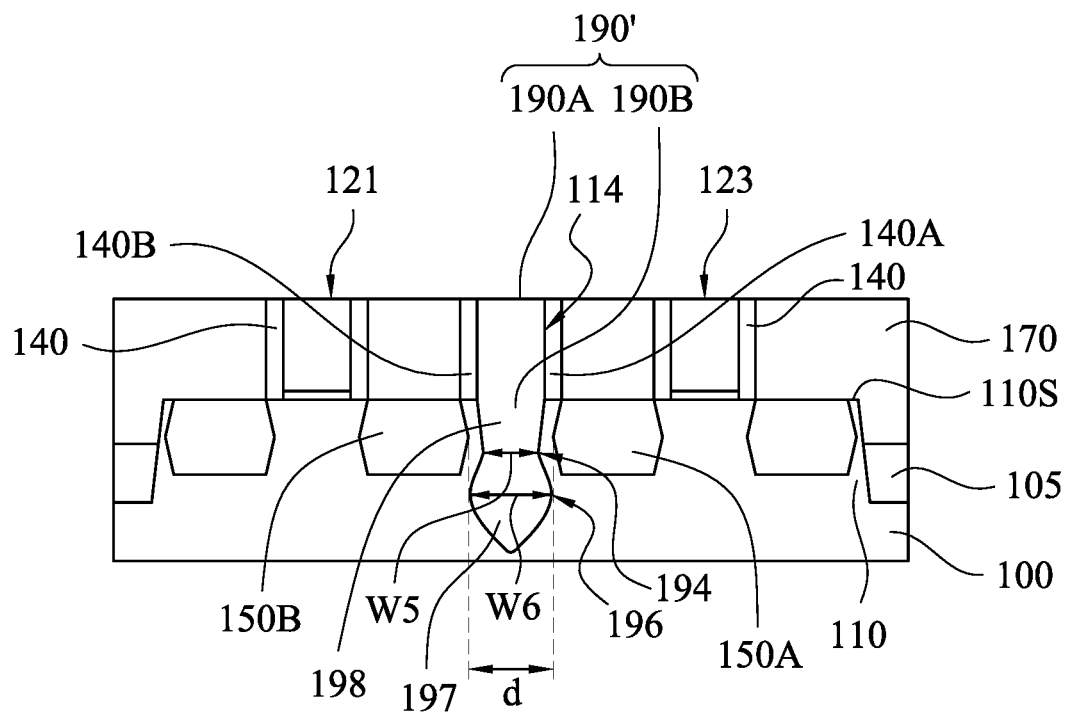

Reference is made to FIGS. 9A and 9B. A planarization process, such as a chemical mechanical polish (CMP) process, is performed to the dielectric layer 190 until the dummy gate stacks 121 and 123 are exposed. The planarization process removes the mask layer 180 and planarizes the top surface of the dielectric layer 190 with the dummy gate stacks 121 and 123, such that the top surfaces of the dummy gate stacks 121 and 123 are substantially level with the top surface of the remained dielectric layer 190. The remaining dielectric layer 190 can be referred to as a dielectric plug 190' embeddedly retained in the gate trench 114 and the recess 116. In other words, the dummy gate stack 122 (see FIGS. 5A and 5B) is replaced by the dielectric plug 190'.

The dielectric plug 190' includes a first portion 190A and second portions 190B below the first portion 190A. The first portion 190A is in between the gate spacers 140, and the second portions 190B are embedded in the semiconductor fins 110. The first portion 190A is above the top surface 110S of the semiconductor fin 110. That is, the dielectric plug 190' extends to a position higher than the top surface 110S of the semiconductor fin 110. In other words, the first portion 190A of the dielectric plug 190' protrudes above the semiconductor fin 110.

The second portion 190B embedded in the semiconductor fin 110 includes a waist 194 having a width W5, in which the width W5 of the waist 194 is less than widths of other portions of the second portion 190B above or below the waist 194. For example, the width W5 is less than a width of a portion 197 below the waist 194 and a width of a portion 198 above the waist 194. That is, the waist 194 is the narrowest portion of the dielectric plug 190'. In some embodiments, the second portion 190B of the dielectric plug 190' includes a widest portion 196, in which a width W6 of the widest portion 196 is greater than the width W4 of the gate trench 114.

In some embodiments, the waist 194 of the second portion 190B of the dielectric plug 190' is in between the source/drain features 150A and 150B. The source/drain features 150A and 150B extend to positions vertically below the spacers 140A and 140B, respectively, in which the first portion 190A is in between the spacers 140A and 140B. The width W5 of the waist 194 is less than a distance d between the two neighboring source/drain features 150. In some embodiments, the distance d is the shortest distance between the two neighboring source/drain features 150. In some other embodiments, the width of the portion 198 of the second portion 190B of the dielectric plug 190' is greater than the distance d between the two neighboring source/drain features 150. In some embodiments, the spacers 140A and 140B abutting the dielectric plug 190' comprise materials the same as that of the gate spacers 140 abutting the dummy gate stacks 121 and 123. This is due to the fact that the spacers 140A and 140B and the gate spacers 140 come from the same deposited dielectric layer.

Figure 10A:
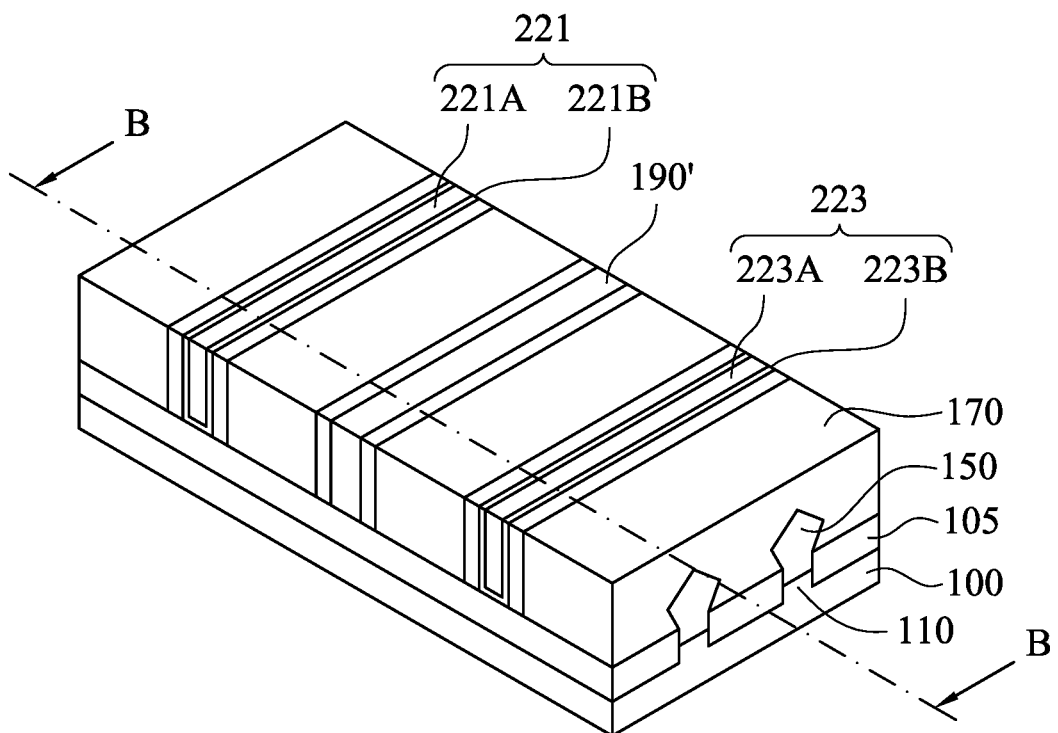
Figure 10B:
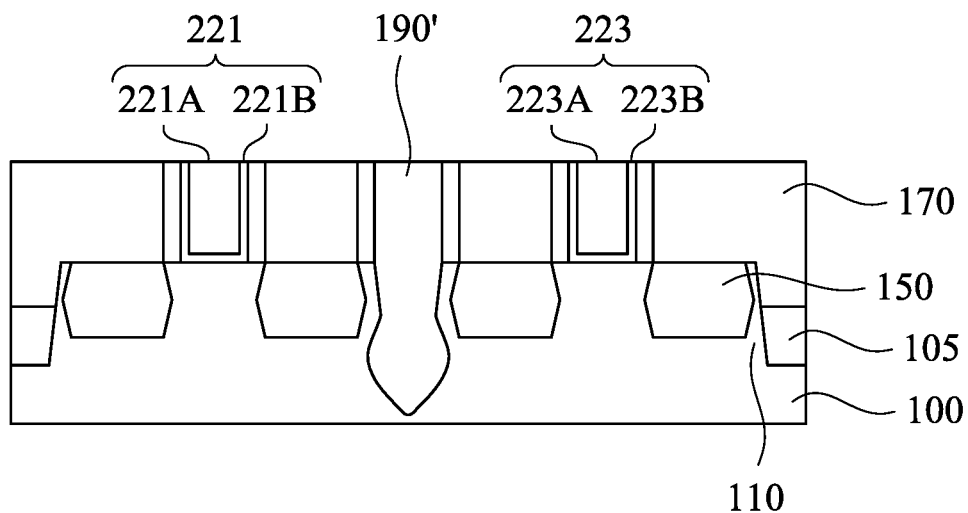

Reference is made to FIGS. 10A and 10B. A replacement gate (RPG) process scheme is employed. The dummy gate stack 121 is replaced with a gate stack 221, and the dummy gate stacks 123 is replaced with a gate stack 223. For example, the dummy gate stacks 121 and 123 (see FIGS. 9A and 9B) are removed to from a plurality of gate trenches. The dummy gate stacks 121 and 123 are removed by a selective etch process, including a selective wet etch or a selective dry etch, and carries a substantially vertical profile of the gate spacers 140. The gate trenches expose portions of the semiconductor fins 110 of the substrate 100. Then, the gate stacks 221 and 223 are formed respectively in the gate trenches and cover the semiconductor fins 110 of the substrate 100. In some embodiments, the top surfaces of the gate stacks 221 and 223 are substantially level with the top surface of the dielectric plug 190'.

The processes described in FIGS. 7A to 9B may also be performed after forming the metal gate stacks in some embodiments. For example, one or more etch operations are carried out to remove a gate stack formed using the RPG process and to recess the underlying fins. Afterwards, a dielectric material is formed in the place of the removed gate stack and the recessed fins. Thereafter, a planarization process, such as CMP, is performed to planarize the dielectric material with other gate stacks formed using the RPG process, such as the gate stacks 221 and 223. The resulting structure is similar to that in FIGS. 10A and 10B.

The gate stacks 221 and 223 include an interfacial layer (not shown), gate dielectrics 221B and 223B formed over the interfacial layer, and gate metals 221A and 223A formed over the gate dielectrics 221B and 223B. The gate dielectrics 221B and 223B, as used and described herein, include dielectric materials having a high dielectric constant, for example, greater than that of thermal silicon oxide (~3.9). The gate metal s 221A and 223A may include a metal, metal alloy, and/or metal silicide.

In some embodiments, the gate metals 221A and 223A included in the gate stacks 221 and 223 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metals 221A and 223A may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process.

In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectrics 221B and 223B may include a high-K dielectric layer such as hafnium oxide ($HfO_2$). Alternatively, the gate dielectric 212 may include other high-K dielectrics, such as $TiO_2$, HfZrO, $Ta_2O3$, $HfSiO_4$, $ZrO_2$, $ZrSiO_2$, LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectrics 221B and 223B may be formed by ALD, PVD, CVD, oxidation, and/or other suitable methods.

FIGS. 11A-20 illustrate a method of manufacturing a semiconductor device at various stages in accordance with some embodiments.

Figure 11A:
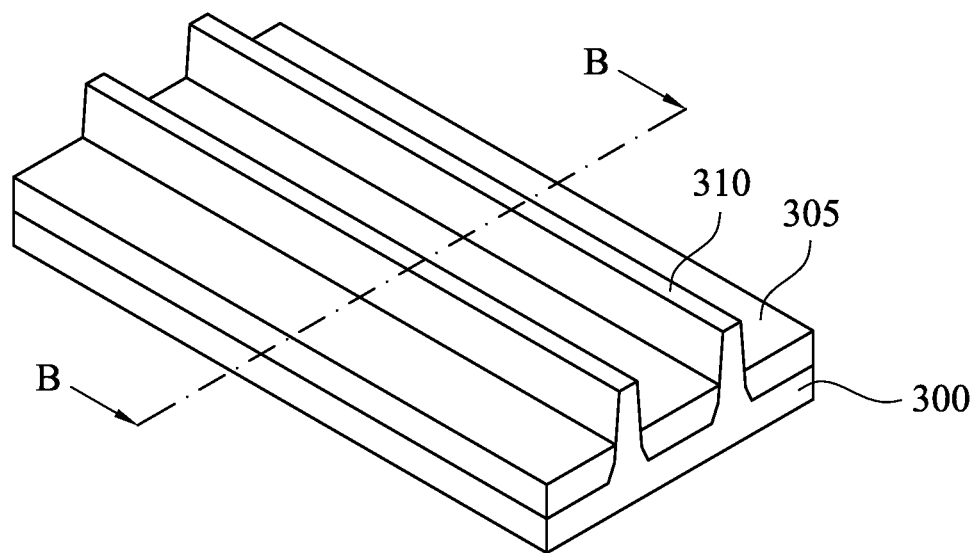
FIGS. 11A-20 illustrate a method of manufacturing a semiconductor device at various stages in accordance with some embodiments.
Figure 11B:
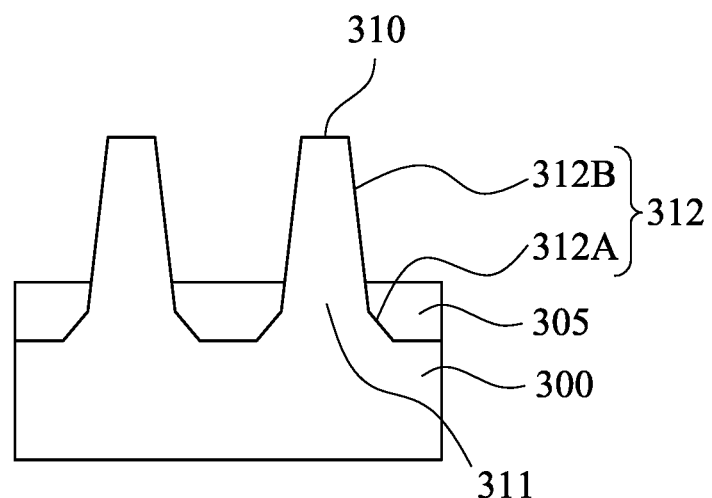

Reference is made to FIGS. 11A and 11B. FIG. 11B is cross-sectional views along line B-B of FIG. 11A. A plurality of semiconductor fins 310 are formed on the substrate 300. For example, two semiconductor fins 310 are formed over the substrate 300 in FIG. 11A. A plurality of isolation structures 305 are formed over the substrate 100 and adjacent to the semiconductor fins 310. In FIG. 11B, in some embodiments, a sidewall 312 of the semiconductor fins 310 has a first segment 312A and a second segment 312B extending upward from a top of the first segment 312A, and the first and second segments 312A and 312B of the sidewall 312 have different slopes. For example, the slope of the second segment 312B is greater than the slope of the first segment 312A. The slope difference may result from manufacturing processes (e.g. etching) of the semiconductor fins 310 in some embodiments.

Figure 12:
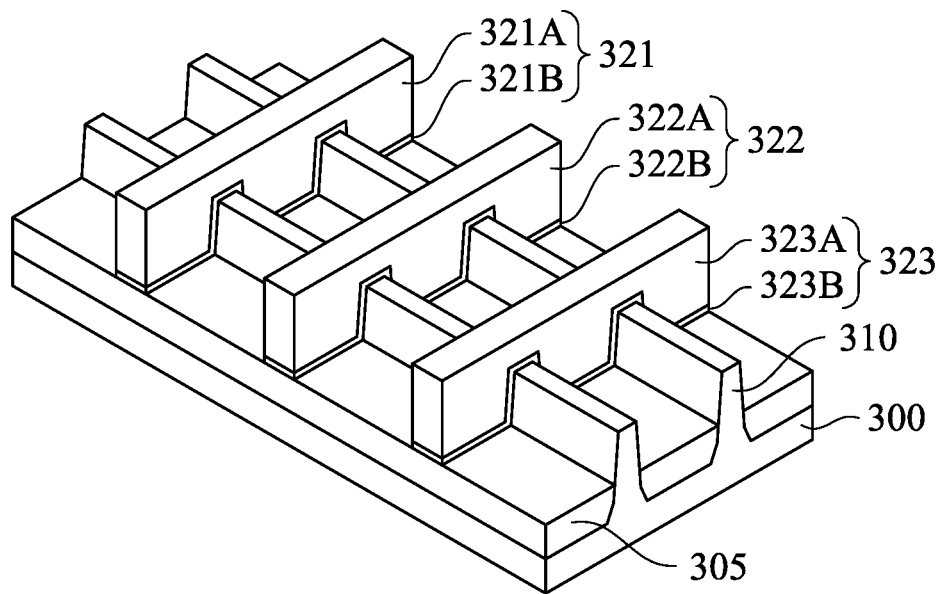

Reference is made to FIG. 12. A plurality of dummy gate stacks 321, 322, and 323 are formed over the semiconductor fins 310 of the substrate 100, in which the dummy gate stack 322 is between the dummy gates 321 and 323. In some embodiments, the dummy gate stack 321 includes a dummy gate 321A and a gate dielectric 321B underlying the dummy gate 321A, the dummy gate stack 322 includes a dummy gate 322A and a gate dielectric 122B underlying the dummy gate 122A, and the dummy gate stack 323 includes a dummy gate 323A and a gate dielectric 323B underlying the dummy gate 323A. Formation of the dummy gate stacks 321, 322 and 323 is analogous to that is described above and is thus not repeated herein.

Figure 13:
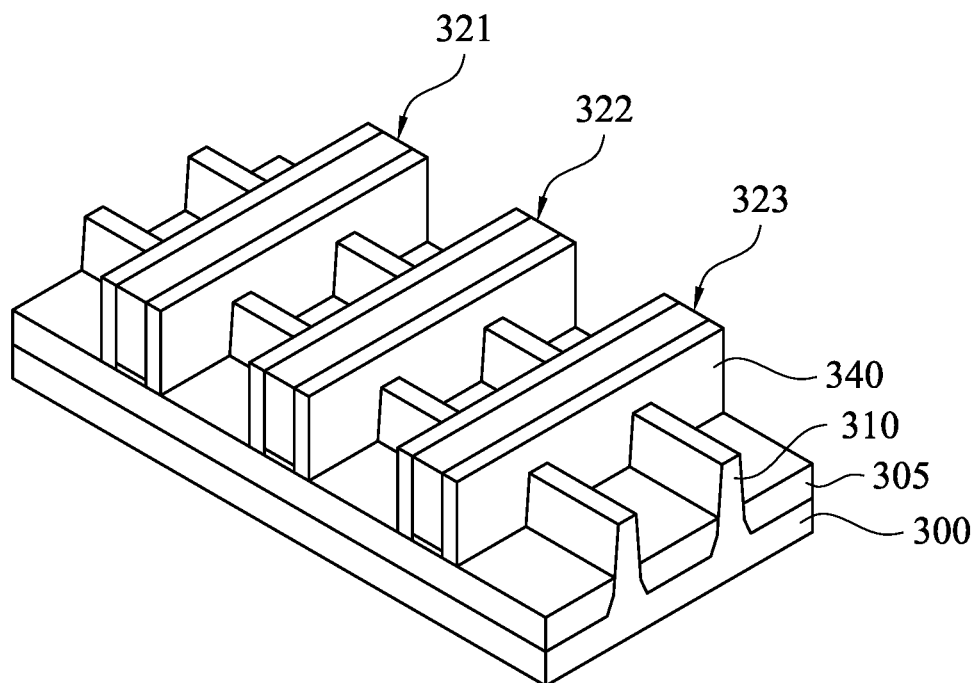

Reference is made to FIG. 13. A plurality of gate spacers 340 are formed respectively on opposite sidewalls of the dummy gate stacks 321, 322, and 323. Formation of the gate spacers 340 is analogous to that is described above and is thus not repeated herein.

Figure 14:
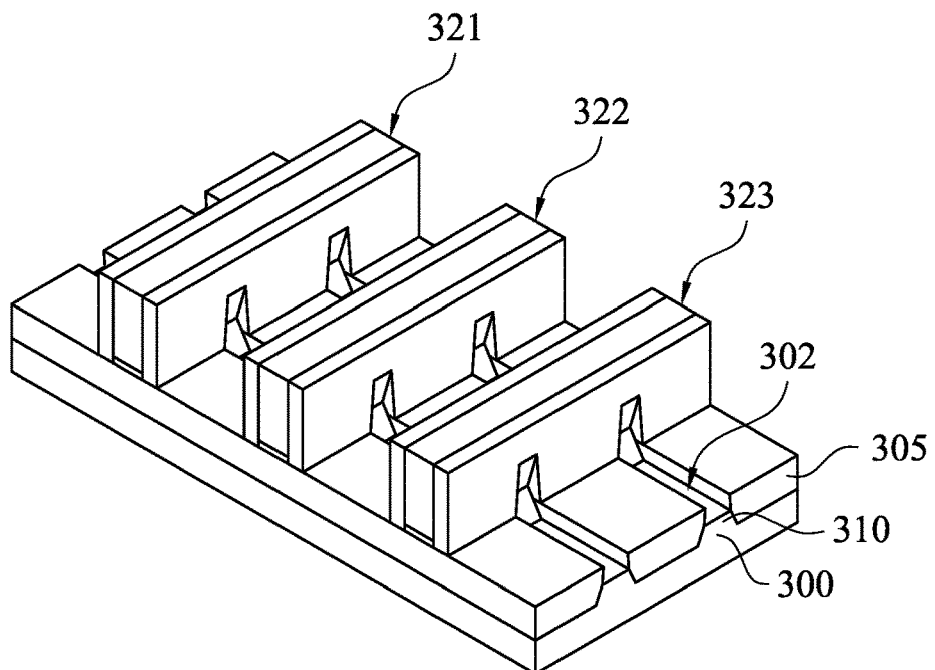

Reference is made to FIG. 14. One or more recessing processes are performed to the semiconductor fins 310 of the substrate 300 to form a plurality of recesses 302 in the semiconductor fins 310 of the substrate 100. Formation of the recesses 302 is analogous to that is described above and is thus not repeated herein.

Figure 15:
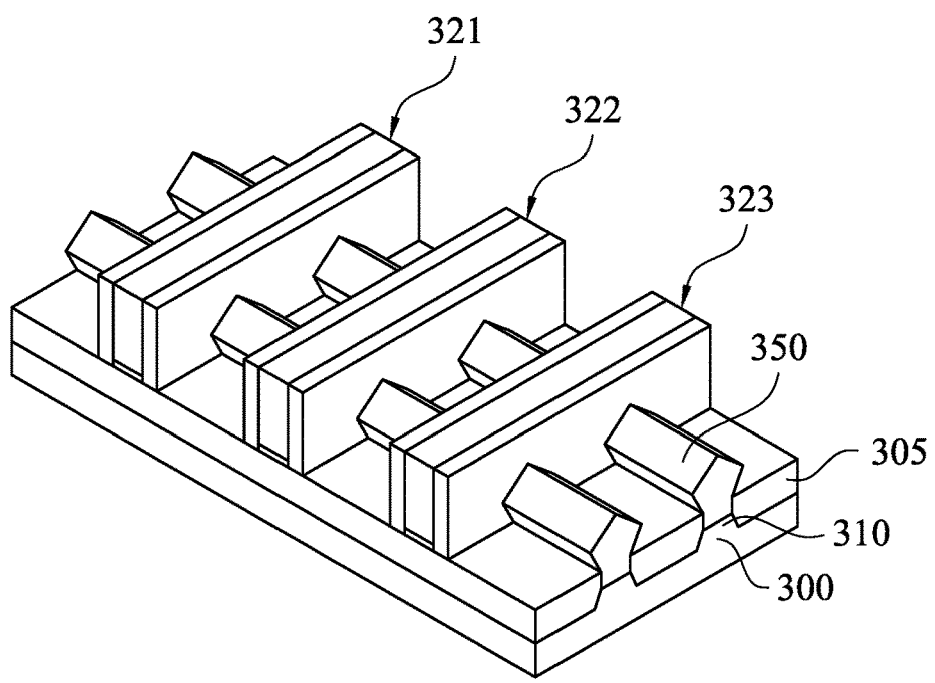

Reference is made to FIG. 15. A plurality of source/drain features 350 are respectively formed in the recesses 302 (shown in FIG. 14) of the semiconductor fins 310 of the substrate 300. At least one of the source/drain features 350 is formed between the dummy gate stacks 321 and 322, and at least one of the source/drain features 350 is formed between the dummy gate stacks 322 and 323. Formation of the source/drain features 350 is analogous to that is described above and is thus not repeated herein.

Figure 16A:
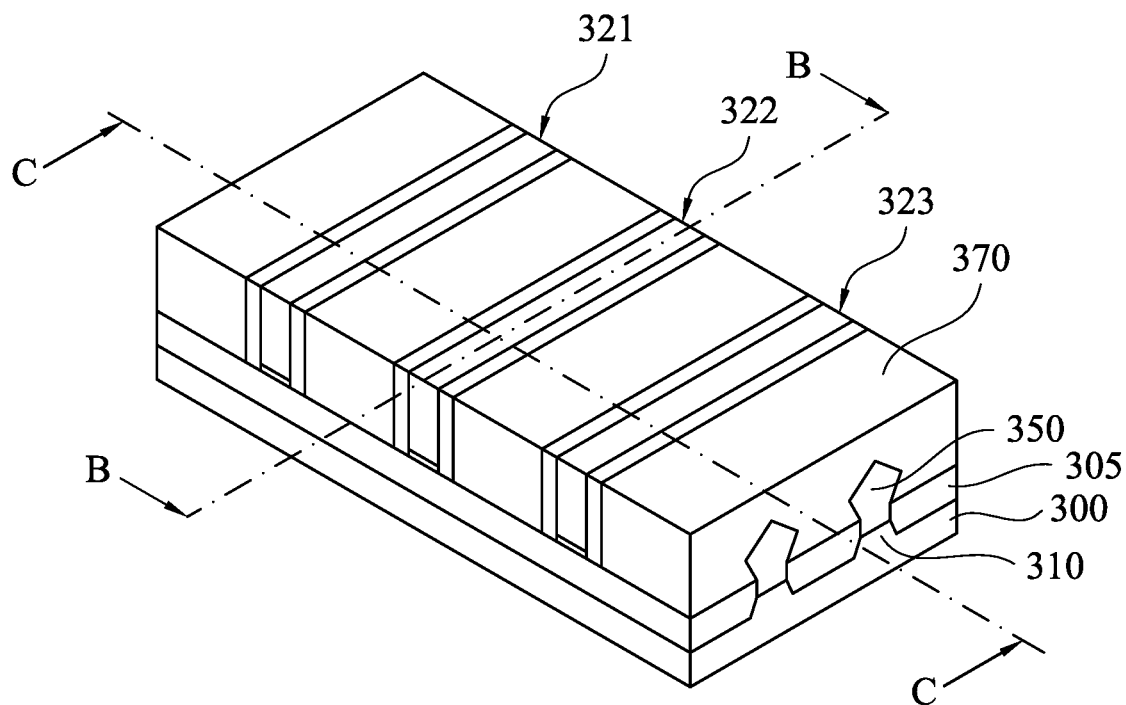
Figure 16B:
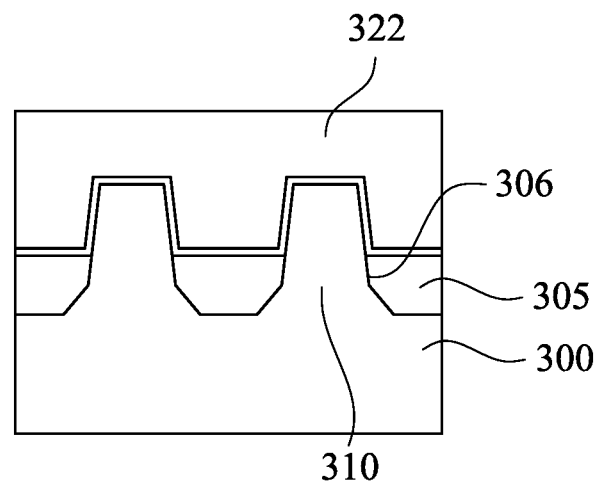
Figure 16C:
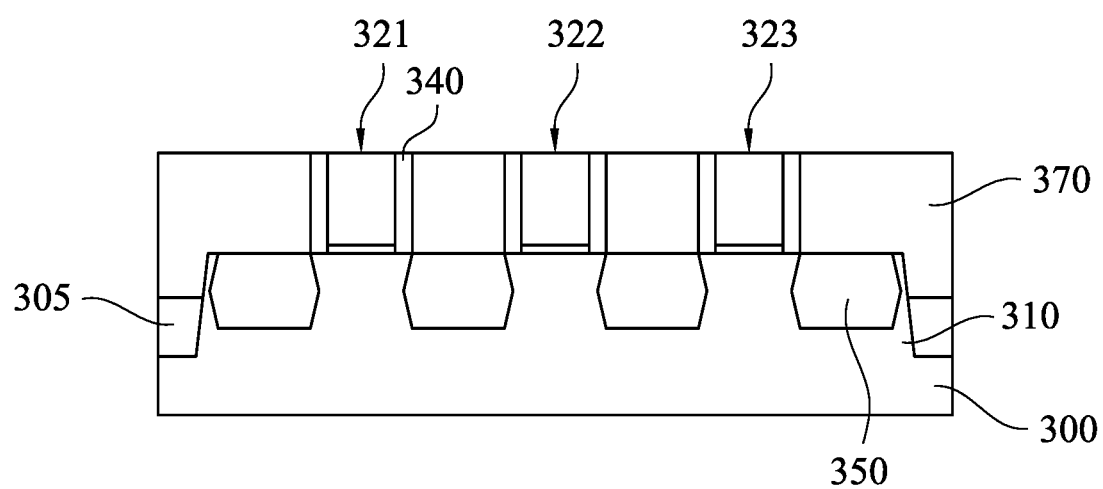

Reference is made to FIGS. 16A, 16B and 16C. FIG. 16B is cross-sectional views along line B-B of FIG. 16A. FIG. 16C is cross-sectional views along line C-C of FIG. 16A. After the source/drain features 350 are formed, an interlayer dielectric 370 is formed over the substrate 300 and at outer sides of the gate spacers 140. Accordingly, the interlayer dielectric 370 covers the source/drain features 350 and portions of the semiconductor fins 310 of the substrate 300. Formation of the interlayer dielectric 370 is analogous to that is described above and is thus not repeated herein.

Figure 17A:
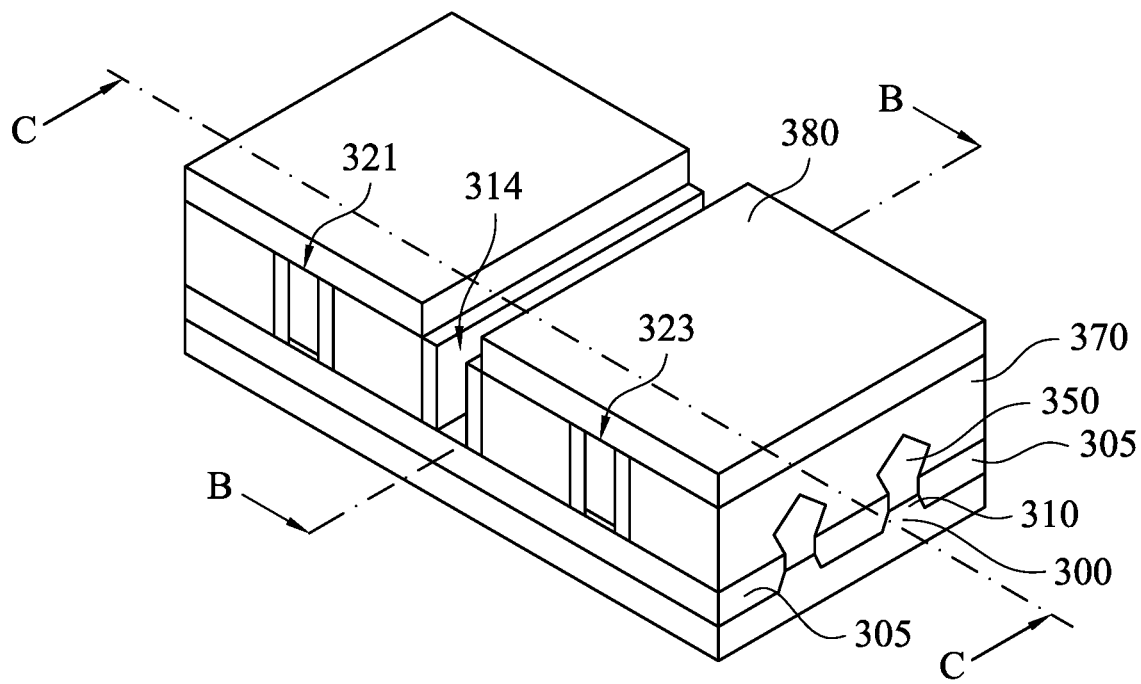
Figure 17B:
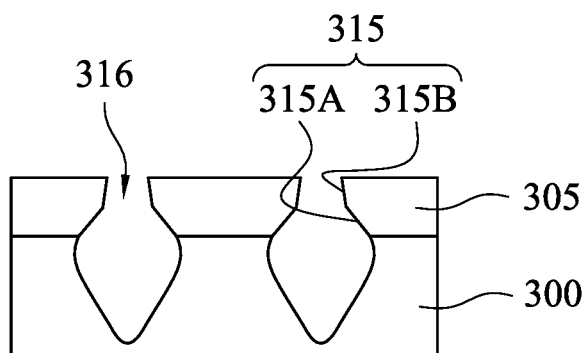
Figure 17C:
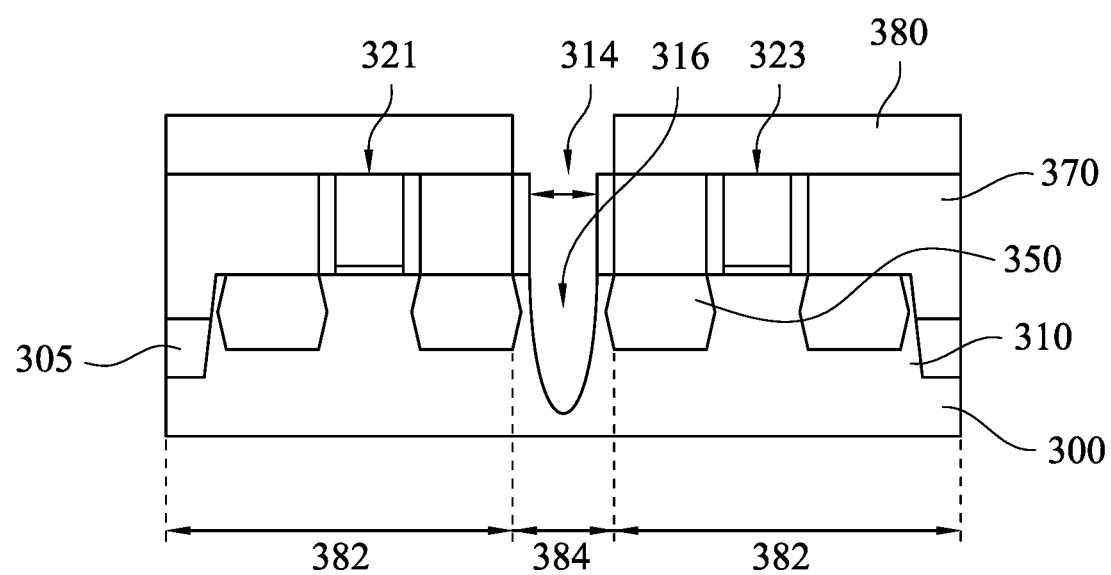

Reference is made to FIGS. 17A, 17B and FIG. 17C. FIG. 17B is a cross-sectional view along line B-B of FIG. 17A. FIG. 17C is a cross-sectional view along line C-C of FIG. 17A. A patterned mask 380 is formed over the semiconductor fins 310 of the substrate 300. In some embodiments, the mask 180 is formed over the interlayer dielectric 370 and the dummy gates 321 and 323 to define two masked regions 382 and an unmasked region 384. In other words, the mask 380 exposes the dummy gate stack 322 (see FIG. 16A) in the unmasked region 384, and the dummy gate stacks 321 and 323 in the masked regions 382 may be protected by the hard mask 380 during processes performed later.

Then, one or more etching processes are performed. In some embodiments, for example, one or more etching processes are performed to remove the dummy gate stack 322. After the dummy gate stack 322 is removed, a gate trench 314 is formed between the gate spacers 340, and portions of the semiconductor fins 310 are exposed at a bottom of the gate trench 314. Thereafter, an etching process is performed to form recesses 316 in the substrate 300. The gate trench 314 is vertically above the recesses 316 in the substrate 300. The gate trench 314 is spatially communicated with the underlying recess 316.

Referring back to FIG. 11B. The sidewall 312 of the semiconductor fin 310 has a first segment 312A and a second segment 312B having different slopes. Such a slope difference may adversely affect the isolation performance of a subsequently formed dielectric plug. This is due to the fact that the slope difference may result in difficult of removing bottom portions 311 of the semiconductor fins 310, and such unremoved portions of the bottom portions 311 would cause leakage current.

As a result, in some embodiments, one or more etching parameters of the etching process for forming the recesses 316 are tuned to fully remove the bottom portions 311 of the semiconductor fins 310. In some embodiments, the etching parameters include total pressure of etch gas(es), partial pressure of oxygen in the etch gases, radio frequency (RF) bias voltage, RF bias power, the like or combinations thereof. As a result of the tuned etching parameters, the bottom portions 311 of the semiconductor fins 310 can be completely removed.

From other perspectives, the material of semiconductor fin 310 on the sidewalls 315 of the isolation structure 305 is removed during the etching processes. Thus, the recesses 316 expose sidewalls 315 of the isolation structures 305. The resulting sidewall 315 and the sidewall 312 of the removed portion of semiconductor fin 310 may have substantially the same profile. For example, the sidewall 315 of the isolation structure 305 has a first segment 315A and a second segment 315B extending upward from a top of the first segment 315A, and the first and second segments 315A and 315B of the sidewall 315 have different slopes. For example, the slope of the second segment 315B is greater than the slope of the first segment 315A.

Figure 18A:
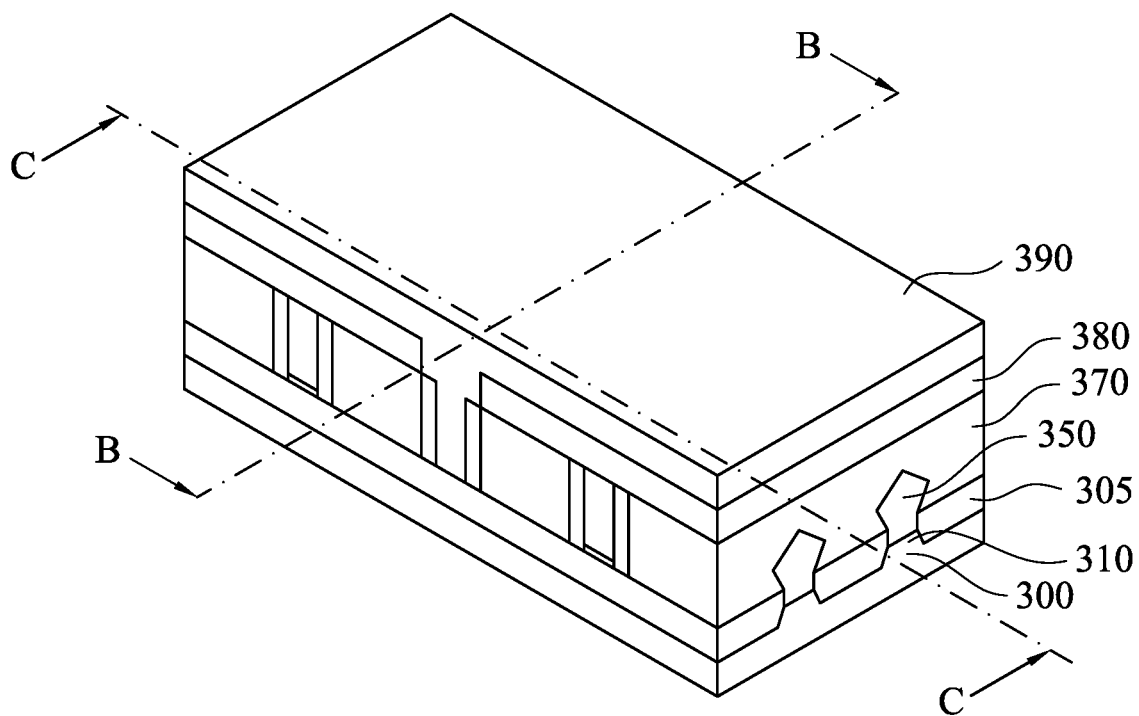
Figure 18B:
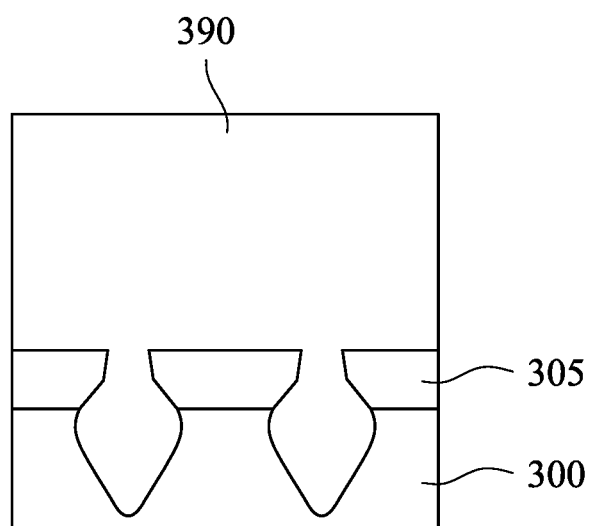
Figure 18C:
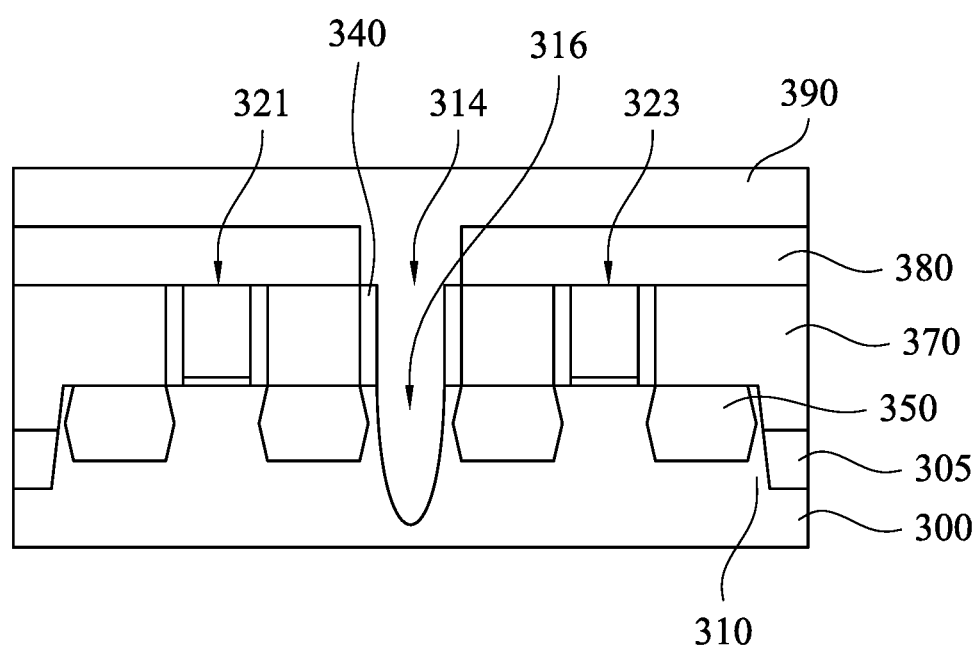

Reference is made to FIGS. 18A, 18B and 18C. FIG. 18B is cross-sectional views along line B-B of FIG. 18A. FIG. 18B is cross-sectional views along line B-B of FIG. 18A. FIG. 18C is cross-sectional views along line C-C of FIG. 18A. A dielectric layer 390 is formed over the semiconductor fins 310 of the substrate 300 and filling the gate trench 314 and recess 316 shown in FIGS. 17B and 17C. In some embodiments, the dielectric layer 390 may include silicon nitride, silicon oxynitride, silicon oxycarbonitride, silicon carbide, silicon germanium, or combinations thereof. In some embodiments, air gaps may be created in the dielectric layer 390.

Figure 19A:
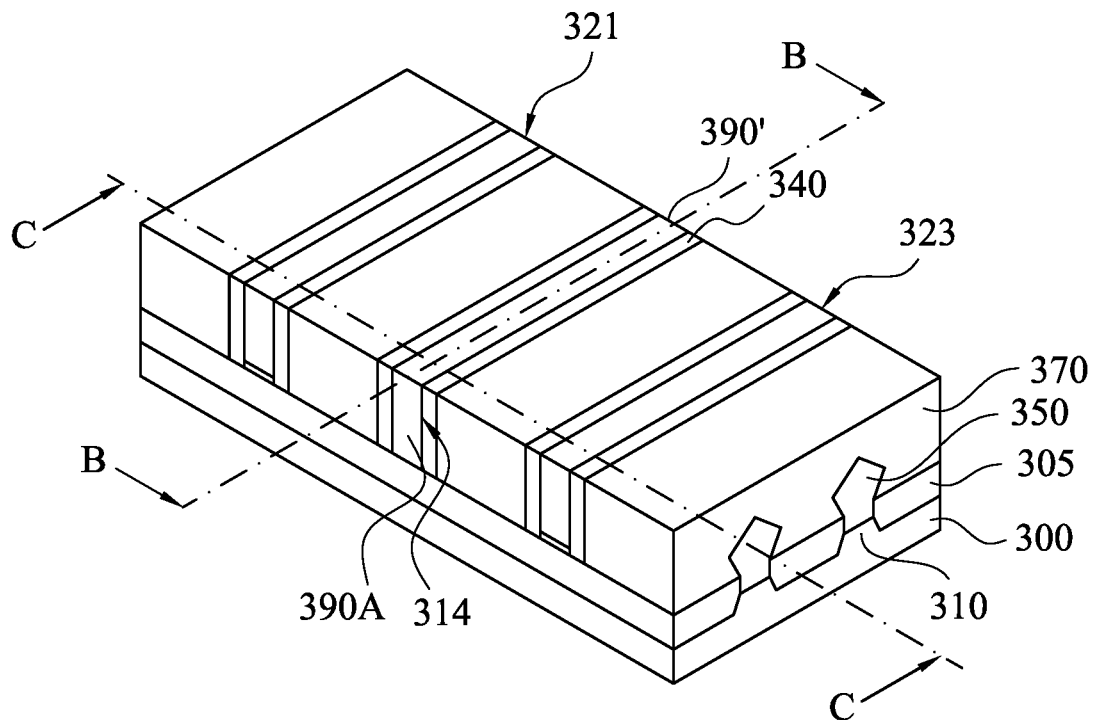
Figure 19B:
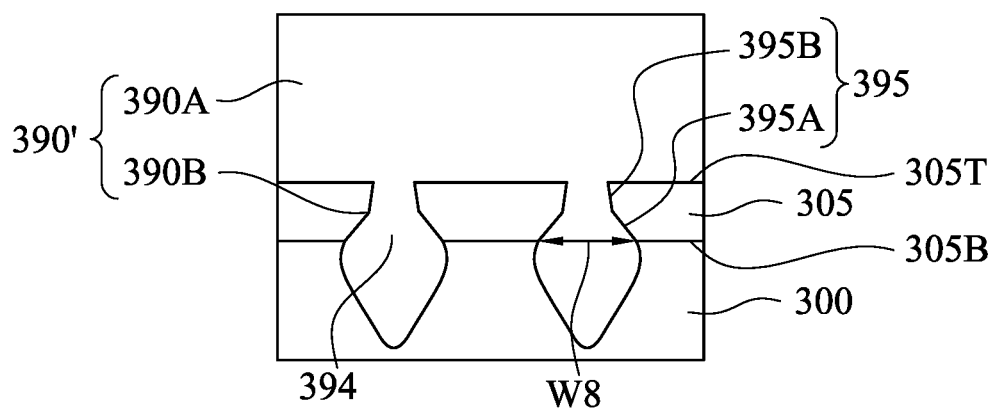
Figure 19C:
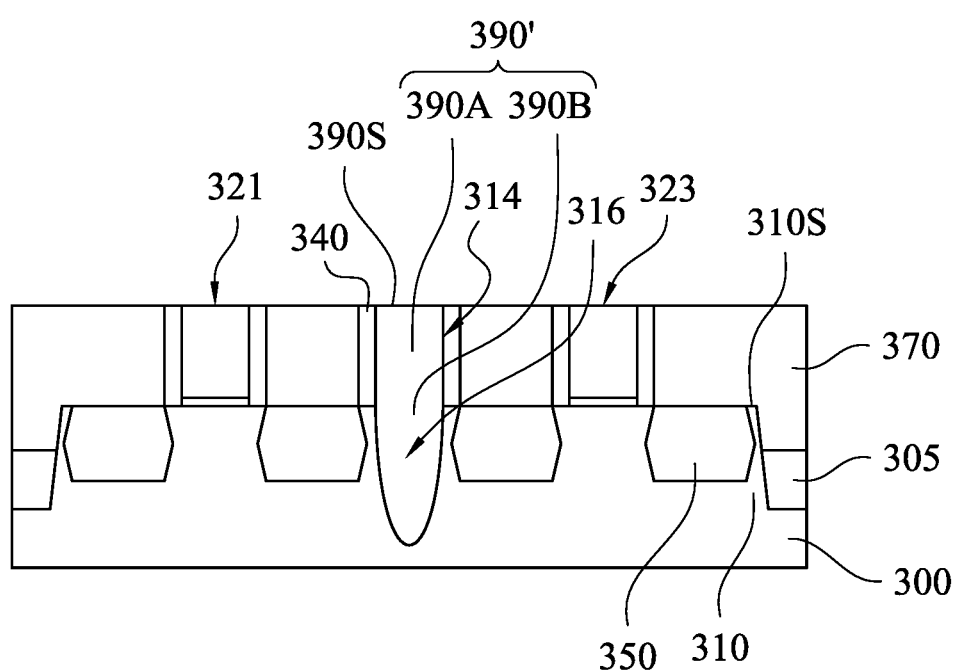

Reference is made to FIGS. 19A, 19B and 19C. FIG. 19B is cross-sectional views along line B-B of FIG. 19A. FIG. 19C is cross-sectional views along line C-C of FIG. 19A. A planarization process, such as a chemical mechanical polish (CMP) process, is performed to the dielectric layer 390 until the dummy gate stacks 321 and 323 are exposed. The planarization process removes the mask layer 380 and planarizes a top surface of the dielectric layer 390 with the dummy gate stacks 321 and 323. The remaining dielectric layer 390 can be referred to as a dielectric plug 390' embeddedly retained in the gate trench 314 and the recess 316. In other words, the dummy gate stack 322 (see FIG. 16A) is replaced by the dielectric plug 390'.

The dielectric plug 390' includes a first portion 390A and second portions 390B extending downward from the first portion 390A. The first portion 390A is in between the gate spacers 340, and the second portion 390B is embedded in the semiconductor fins 310. The first portion 390A of the dielectric plug 390' has a top surface 390S in a position higher than a top surface 310S of the semiconductor fin 310. Because the sidewall 315 of the recess 316 is free of materials of the semiconductor fins 310, a sidewall 395 of the second portion 390B and the isolation structure 305 are free of materials of the semiconductor fins 310 therebetween, and the sidewall 395 of the second portion 390B may be in contact with the isolation structure 305. As a result, the dielectric plug 390' can provide improved isolation to the neighboring source/drain features 350 on opposite sides of the dielectric plug 390'. For example, Absence of semiconductor materials between the dielectric plug 390' and the isolation structure 305 can prevent or otherwise reduce leakage current flowing between the source/drain features 350 on opposite sides of the dielectric plug 390'. From other perspectives, the sidewall 395 may be referred to as an interface between the dielectric plug 390' and the isolation structure 305, in that the interface extends from a top surface 305T to a bottom surface 305B of the isolation structure 305.

In some embodiments, the sidewall 395 of the second portion 390B of the dielectric plug 390' and the sidewall 315 of the recess 316 (See FIG. 17B) may have substantially the same profile. For example, the sidewall 395 of the second portion 390B has a first segment 395A and a second segment 395B extending upward from a top of the first segment 395A, and the first and second segments 395A and 395B have different slopes. For example, the slope of the second segment 395B is greater than the slope of the first segment 395A.

Figure 20:
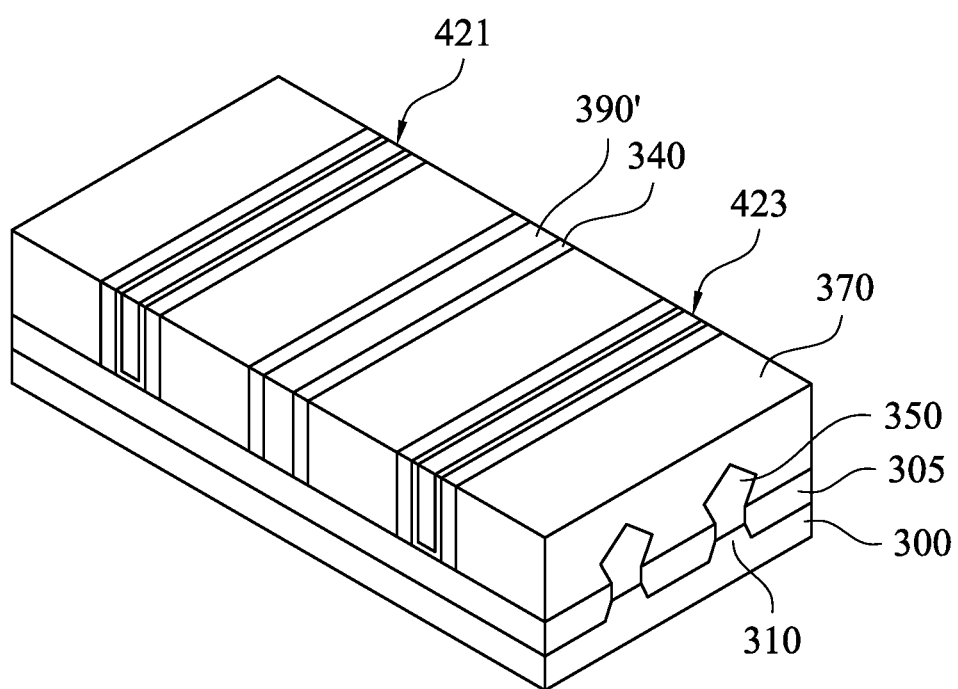

Reference is made to FIG. 20. A replacement gate (RPG) process scheme is employed. The dummy gate stack 321 is replaced with a gate stack 421, and the dummy gate stacks 323 is replaced with a gate stack 423, respectively. Formation of the gate stacks 421 and 423 is analogous to that is described above and is thus not repeated herein.

The processes described in FIGS. 17A to 19C may also be performed after forming the metal gate stacks in some embodiments. For example, one or more etch operations are carried out to remove a gate stack formed using the RPG process and to recess the underlying fins. Afterwards, a dielectric material is formed in the place of the removed gate stack and the recessed fins. Thereafter, a planarization process, such as CMP, is performed to planarize the dielectric material with other gate stacks formed using the RPG process, such as the gate stacks 421 and 423. The resulting structure is similar to that in FIG. 20.

Based on the above discussions, it can be seen that the method illustrated in FIGS. 11A-20 may share some steps and/or features of the method illustrated in FIGS. 1A-10B. However, it is understood that not all steps and/or features of the method illustrated in FIGS. 1A-10B are necessary for the method illustrated in FIGS. 11A-20. Similarly, not all steps and/or features of the method illustrated in FIGS. 11A-20 are necessary for the method illustrated in FIGS. 1A-10B. Moreover, it can be seen that the present disclosure offers advantages over FinFET devices. It is understood, however, that other embodiments may offer additional advantages, and not all advantages are necessarily disclosed herein, and that no particular advantage is required for all embodiments. One advantage is that a dielectric plug extends into a semiconductor fin to interpose two neighboring source/drain features, and hence the dielectric plug can act as an isolation feature between two transistors. Another advantage is that the dielectric plug is separated from (or spaced apart from) the neighboring source/drain features, and hence the source/drain features will not be affected or even damaged by the dielectric plug. Another advantage is that a recess in the substrate for receiving the dielectric plug can be formed with a waist in between neighboring epitaxy source/drain features, such that the source/drain features will be free of damage during etching the recess. Another advantage is that a lower portion of the recess below the waist can be formed as wider than the waist, and hence the dielectric plug in the recess can provide sufficient isolation to the source/drain features. Yet another advantage is that a sidewall of the dielectric plug and the STI structure are free of a semiconductor material therebetween, and hence leakage current occurring between the source/drain features on opposite sides of the dielectric plug can be prevented or otherwise reduced.

In some embodiments, a device includes a semiconductor fin, a first transistor, a second transistor and a dielectric structure. The first semiconductor fin extends from a substrate. The first transistor is formed on a first region of the semiconductor fin. The second transistor is formed on a second region of the semiconductor fin laterally spaced apart from the first region of the semiconductor fin. The dielectric structure has a lower portion extending in the semiconductor fin and between the first transistor and the second transistor. The lower portion of the dielectric structure has a width increasing from a bottommost position of the dielectric structure to a first position higher than the bottommost position of the dielectric structure and decreasing from the first position to a second position higher than the first position.

In some embodiments, a device includes first and second semiconductor fin, a source/drain region of a first transistor, a source/drain region of a second transistor, and a dielectric structure. The first semiconductor fin and the second semiconductor fin extend from a substrate. The source/drain region of the first transistor is formed in the first semiconductor fin. The source/drain region of the second transistor is formed in the second semiconductor fin. The dielectric structure is between a longitudinal end of the first semiconductor fin and a longitudinal end of the second semiconductor fin, and laterally spaces the source/drain region of the first transistor apart from the source/drain region of the second transistor. The dielectric structure has a greater width at a position below bottoms of the source/drain regions of the first and second transistors than at a position above the bottoms of the source/drain regions of the first and second transistors.

In some embodiments, a device includes a semiconductor fin, a STI region, first and second epitaxy structures, and a dielectric structure. The semiconductor fin is over a substrate. The STI region laterally surrounds a lower portion of the semiconductor fin. The first and second epitaxy structures are formed on the semiconductor fin. The dielectric structure extends downwardly through the semiconductor fin and the STI region into the substrate, and disposed between the first and second epitaxy structures. When viewed in a cross section taken along a direction perpendicular to a longest side of the semiconductor fin, a sidewall of the dielectric structure has a turning point in the vicinity of a bottom surface of the STI region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
 a semiconductor fin disposed extending from a semiconductor substrate;
 a first transistor having a first gate structure over the semiconductor fin;
 a second transistor having a second gate structure over the semiconductor fin; and
 a dielectric structure between the first gate structure and the second gate structure,
 wherein the dielectric structure extends to at least a level of a top surface of the first gate structure and a top surface of the second gate structure; and
 wherein the dielectric structure has a width increasing from a bottom position of the dielectric structure in the semiconductor fin to a first position higher than the bottom position of the dielectric structure and in the semiconductor fin, and wherein a width of the first gate structure is less than the width of the dielectric structure in the semiconductor fin at the first position.

2. The device of claim 1, wherein the dielectric structure has a first slope from the bottom position to the first position, and a second slope from the first position to a second position higher than the first position, and the second slope is different from the first slope.

3. The device of claim 1, wherein the dielectric structure comprises more than one material.

4. The device of claim 1, wherein the dielectric structure at the first position interfaces a material of the semiconductor substrate.

5. The device of claim 1, wherein the dielectric structure is spaced apart from the first gate structure of the first transistor by a first distance, and spaced apart from a source/drain region of the first transistor by a second distance, and wherein the second distance is smaller than the first distance.

6. The device of claim 1, wherein the dielectric structure is spaced apart from source/drain regions of the first transistor and source/drain regions of the second transistor.

7. A device, comprising:
 a first transistor over a semiconductor fin, the semiconductor fin extending upwards from a substrate;
 a second transistor over the semiconductor fin; and
 an isolation structure isolating the first transistor from the second transistor, the isolation structure having:
  a lower dielectric portion in the semiconductor fin and lower than tops of source/drain regions of the first and second transistors; and
  an upper dielectric portion above the semiconductor fin and higher than the tops of the source/drain regions of the first and second transistors, wherein a sidewall of the lower dielectric portion in the semiconductor fin has more slope change than a sidewall of the upper dielectric portion above the semiconductor fin, and the upper dielectric portion has a width greater than a minimal width of the lower dielectric portion.

8. The device of claim 7, wherein the sidewall of the lower dielectric portion has two or more slope changes.

9. The device of claim 7, wherein the isolation structure comprises more than one material.

10. The device of claim 7, wherein a bottom position of the isolation structure is lower than a bottom of a shallow trench isolation (STI) region in the substrate.

11. The device of claim 7, wherein the lower dielectric portion comprises has a width increasing from a bottom of the lower dielectric portion to a first position higher than the bottom of the lower dielectric portion, and wherein a width of a first gate structure of the first transistor is less than the width of the lower dielectric portion at the first position, and wherein in a cross-sectional view, a top surface of the isolation structure is not covered by any gate structures.

12. A device, comprising:
 a first transistor formed on a first region of a semiconductor fin;
 a second transistor formed on a second region of the semiconductor fin; and
 a dielectric structure isolating the first transistor from the second transistor, wherein the dielectric structure is spaced apart from source/drain regions of the first transistor and source/drain regions of the second transistor, and the dielectric structure comprises a non-linear sidewall profile, the non-linear sidewall profile comprises a bottom sidewall, a first sidewall above the bottom sidewall, and a second sidewall above the first sidewall, wherein the bottom sidewall and the first sidewall are each disposed in the semiconductor fin, wherein the bottom sidewall is tilted from a direction normal to a substrate by a first angle, the first sidewall and the bottom sidewall form an included angle greater than the first angle, and the second sidewall is non-parallel with the bottom sidewall and the first sidewall.

13. The device of claim 12, wherein the bottom sidewall of the dielectric structure interfaces the substrate.

14. The device of claim 12, wherein the first sidewall of the dielectric structure interfaces the substrate.

15. The device of claim 12, wherein the second sidewall of the dielectric structure extends along the direction normal to the substrate.

16. The device of claim 12, wherein the second sidewall of the dielectric structure is above a top position of the substrate.

17. The device of claim 12, wherein the dielectric structure comprises more than one material.

18. The device of claim 12, wherein the bottom sidewall of the dielectric structure is lower than a bottom of a shallow trench isolation (STI) region in the substrate.

19. The device of claim 12, wherein the first angle is an obtuse angle.

20. The device of claim 12, wherein the first angle and the included angle are each measured from above the bottom sidewall.

* * * * *